US012727471B2

(12) United States Patent
Su

(10) Patent No.: US 12,727,471 B2
(45) Date of Patent: Sep. 1, 2026

(54) SEMICONDUCTOR DEVICE WITH FILLING LAYER AND METHOD FOR FABRICATING THE SAME

(71) Applicant: NANYA TECHNOLOGY CORPORATION, New Taipei City (TW)

(72) Inventor: Kuo-Hui Su, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 377 days.

(21) Appl. No.: 18/534,948

(22) Filed: Dec. 11, 2023

(65) Prior Publication Data

US 2025/0192056 A1 Jun. 12, 2025

(51) Int. Cl.

| | |
|---|---|
| ***H10W 20/47*** | (2026.01) |
| ***H10W 20/00*** | (2026.01) |
| ***H10W 20/41*** | (2026.01) |
| ***H10W 20/42*** | (2026.01) |
| ***H10W 20/46*** | (2026.01) |

(52) U.S. Cl.

CPC ......... *H10W 20/47* (2026.01); *H10W 20/072* (2026.01); *H10W 20/098* (2026.01); *H10W 20/42* (2026.01); *H10W 20/435* (2026.01); *H10W 20/46* (2026.01); *H10W 20/033* (2026.01); *H10W 20/076* (2026.01); *H10W 20/081* (2026.01); *H10W 20/425* (2026.01)

(58) Field of Classification Search

CPC . H10W 20/47; H10W 20/072; H10W 20/098; H10W 20/46; H10W 20/42; H10W 20/435; H10W 20/425; H10W 20/033; H10W 20/081; H10W 20/076

See application file for complete search history.

(56) References Cited

U.S. PATENT DOCUMENTS

2015/0372102 A1 12/2015 Usami
2020/0027725 A1* 1/2020 Weimer ............ H01J 37/32357
2020/0161450 A1* 5/2020 Huang ............... H10D 30/0215

FOREIGN PATENT DOCUMENTS

CN 117153771 A 12/2023
TW 589452 B 6/2004

(Continued)

OTHER PUBLICATIONS

Office Action and and the search report mailed on Nov. 21, 2024 related to Taiwanese Application No. 113125941.

(Continued)

*Primary Examiner* — Richard A Booth

(74) *Attorney, Agent, or Firm* — Xuan Zhang

(57) ABSTRACT

The present disclosure provides a semiconductor device and a method for fabricating the same. The semiconductor device includes a substrate; a gate electrode disposed on the substrate; a source region and a drain region disposed in the substrate and on opposite sides of the gate electrode; an isolating layer disposed over the substrate and the gate electrode; a plurality of metal contacts disposed in the gate electrode, the source region, and the drain region; a plurality of conductive plugs disposed in the isolating layer and electrically coupled to the metal contacts; a contact liner surrounding the conductive plugs; and a filling layer disposed in the isolating layer. The filling layer includes boron carbonitride.

10 Claims, 28 Drawing Sheets

(56) References Cited

FOREIGN PATENT DOCUMENTS

| | | | |
|---|---|---|---|
| TW | 201911425 | A | 3/2019 |
| TW | 202018114 | A | 5/2020 |
| TW | 202021082 | A | 6/2020 |
| TW | 202213638 | A | 4/2022 |
| TW | 202230721 | A | 8/2022 |
| TW | 202303682 | A | 1/2023 |

OTHER PUBLICATIONS

Office Action and and the search report mailed on Aug. 5, 2024 related to Taiwanese Application No. 113106806.

Summary translation of Office Action and and the search report mailed on Aug. 5, 2024 related to Taiwanese Application No. 113106806.

* cited by examiner 201E
203E
30
201
203
D2
201P
203P
B
B'
MA1
MA3
201P
203P
A
A'
D1
201S-3
203S-1
201S-1
203S-3
201P
203P
20
201E
203E 201E
203E
30
20
201
203
801
201P
203P
B
B'
MA1
MA3
801
201P
203P
A
A'
201S-3
203S-1
201S-1
203S-3
201P
203P
201E
203E

SEMICONDUCTOR DEVICE WITH FILLING LAYER AND METHOD FOR FABRICATING THE SAME

TECHNICAL FIELD

The present disclosure relates to a semiconductor device and a method for fabricating the semiconductor device, and more particularly, to a semiconductor device with a filling layer and a method for fabricating the semiconductor device with the filling layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demands of computing ability. However, a variety of issues arise during the scaling-down process, and such issues continue to increase. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a gate electrode disposed on the substrate; a source region and a drain region disposed in the substrate and on opposite sides of the gate electrode; an isolating layer disposed over the substrate and the gate electrode; a plurality of metal contacts disposed in the gate electrode, the source region, and the drain region; a contact liner disposed in the isolating layer; a plurality of conductive plugs disposed in the isolating layer, surrounded by the contact liner, and electrically coupled to the metal contacts; and a filling layer disposed in the isolating layer. The filling layer includes boron carbonitride.

Another aspect of the present disclosure provides a semiconductor device including a substrate; a device element disposed on the substrate; a first insulating layer disposed on the substrate and covering the device element; a second insulating layer disposed on the first insulating layer; a plurality of first conductive lines and a plurality of second conductive lines disposed on the second insulating layer; a third insulating layer disposed on the second insulating layer and covering the plurality of first conductive lines and the plurality of second conductive lines; and a filling layer disposed on the second insulating layer and in the third insulating layer. The filling layer includes boron carbonitride.

Another aspect of the present disclosure provides a method for fabricating a semiconductor device including providing a substrate; forming a gate electrode over the substrate; forming a source region and a drain region in the substrate; depositing an isolating layer over the substrate and the gate electrode; providing a patterned photoresist over the isolating layer; forming a plurality of contact holes in the isolating layer to expose the gate electrode, the source region, and the drain region; forming a plurality of metal contacts in the gate electrode, the source region, and the drain region; forming a contact liner in the contact holes; forming a plurality of conductive plugs in the contact holes, wherein the plurality of conductive plugs are surrounded by the contact liner; and forming a filling layer in the isolating layer. The filling layer includes boron carbonitride.

Another aspect of the present disclosure provides a method for fabricating a semiconductor device including forming a first conductive line comprising a first protruding portion at one side of the first conductive line; forming a second conductive line comprising a second protruding portion at one side of the second conductive line, wherein the second protruding portion faces toward the first protruding portion; and forming a filling layer between the first protruding portion and the second protruding portion, wherein the filling layer includes boron carbonitride.

Due to the design of the semiconductor device of the present disclosure, parasitic capacitance between a conductive structure including a conductive plug and an adjacent conductive structure including another conductive plug may be reduced by employing a filling layer having low dielectric constant and an air gap. As a result, performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
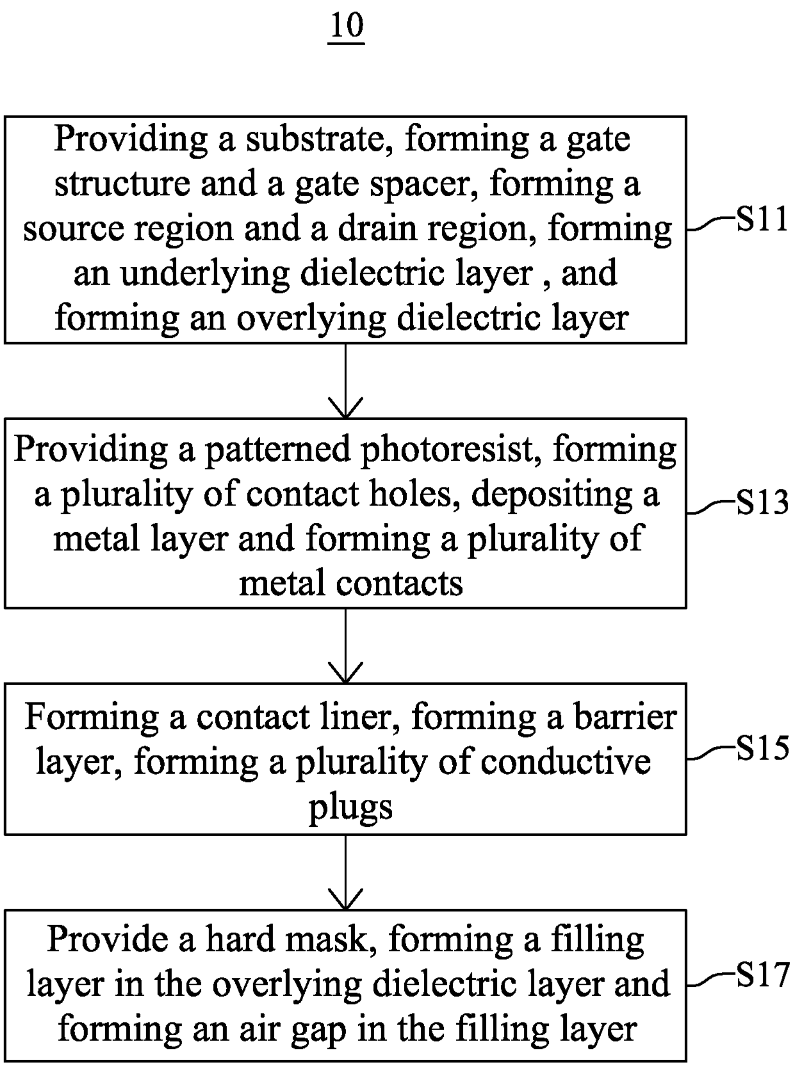
FIG. 1 illustrates, in flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being “connected to” or “coupled to” another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as “same,” “equal,” “planar,” or “coplanar,” as used herein when referring to orientation, layout, location, shapes, sizes, amounts, or other measures do not necessarily mean an exactly identical orientation, layout, location, shape, size, amount, or other measure, but are intended to encompass nearly identical orientations, layouts, locations, shapes, sizes, amounts, or other measures within acceptable variations that may occur, for example, due to manufacturing processes. The term “substantially” may be used herein to reflect this meaning. For example, items described as “substantially the same,” “substantially equal,” or “substantially planar,” may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in flowchart diagram form, a method 10 for fabricating a semiconductor device 1A in accordance with one embodiment of the present disclosure. FIGS. 2 to 20 illustrate, in schematic cross-sectional view diagrams, a flow for fabricating the semiconductor device 1A in accordance with one embodiment of the present disclosure.

With reference to FIGS. 1 to 5, in step S11, a substrate 210 may be provided, a gate structure 220 and a gate spacer 230 may be formed over the substrate 210, a source region 240 and a drain region 242 may be formed in the substrate 210, an underlying dielectric layer 270 may be formed covering the substrate 210, the gate structure 220 and the gate spacer 230, and an overlying dielectric layer 280 may be formed over the gate structure 220, the gate spacer 230 and the underlying dielectric layer 270.

Figure 2:
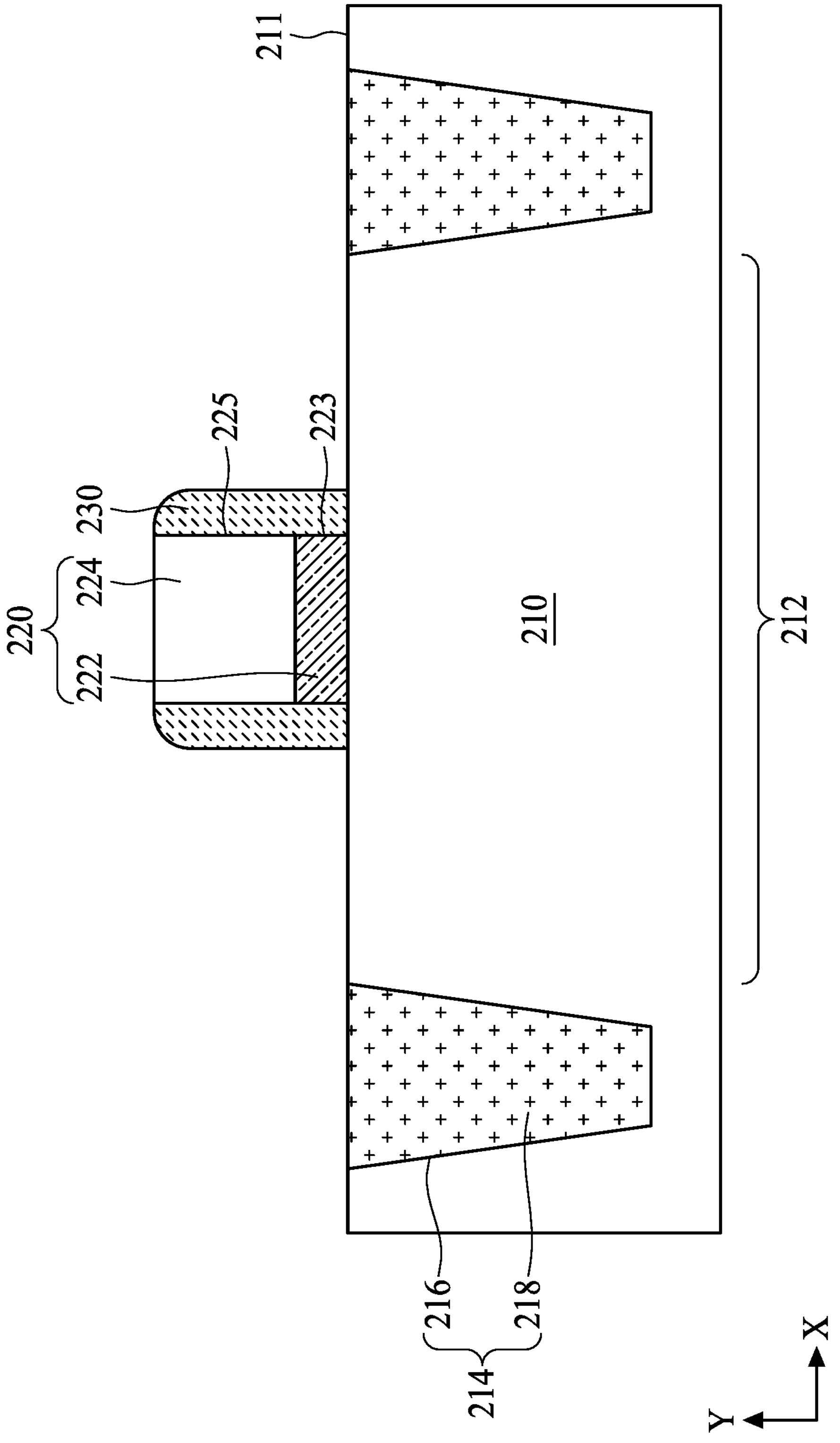
FIGS. 2 to 20 illustrate, in schematic cross-sectional view diagrams, a flow for fabricating the semiconductor device in accordance with one embodiment of the present disclosure.

With reference to FIG. 2, the substrate 210 may be provided. In some embodiments, the substrate 210 is a semiconductor substrate, such as a silicon substrate. In some embodiments, the substrate 210 includes a plurality of active regions 212 (for simplicity, only one active region 212 is shown in FIG. 2) and a plurality of isolating regions 214. In some embodiments, the isolating regions 214 may be formed in the substrate 210 to isolate the active regions 212. In some embodiments, the isolating regions 214 use shallow trench isolation (STI) technology to define and electrically isolate the active regions 212. In some embodiments, the isolating regions 214 are STI regions. In some embodiments, the isolating regions 214 include silicon oxide, silicon nitride, silicon oxynitride, fluoride-doped silicate glass (FSG), a low-k dielectric material, or a combination thereof. In some embodiments, the formation of the isolating regions 214 includes patterning the substrate 210 by a photolithography process, etching one or more trenches 216 in the substrate 210 (for example, by a dry etching process, a wet etching process, and/or a plasma etching process), and filling the trenches 216 (for example, by a chemical vapor deposition process) with one or more dielectric materials 218. In some embodiments, the isolating regions 214 are connected to a front surface 211 of the substrate 210.

In some embodiments, the gate structure 220 and the gate spacer 230 may be formed over the substrate 210. In some embodiments, the gate structure 220 includes a gate dielectric 222 disposed on the front surface 211 and a gate electrode 224 over the gate dielectric 222. In some embodiments, the gate dielectric 222 includes silicon dioxide. In some embodiments, the gate dielectric 222 may be formed by a chemical vapor deposition (CVD) process, an atomic layer deposition (ALD) process, a thermal oxidation process, or the like. In some embodiments, the gate electrode 224 includes polycrystalline silicon (polysilicon). In some embodiments, the gate electrode 224 may be formed by a CVD process, a physical vapor deposition (PVD) process, an ALD process, or another suitable process. In some embodiments, the formation of the gate dielectric 222 and the gate electrode 224 includes forming a blanket gate dielectric layer over the substrate 210 and a blanket gate electrode layer over the blanket gate dielectric layer, and then performing a patterning process and an etching process to remove portions of the blanket gate dielectric layer and portions of the blanket gate electrode layer. Accordingly, the gate dielectric 222 and the gate electrode 224 may be formed.

In some embodiments, the gate spacer 230 is disposed on the front surface 211 of the substrate 210, and on sidewalls 223 of the gate dielectric 222 and sidewalls 225 of the gate electrode 224. In some embodiments, the gate spacer 230 may be formed by depositing a dielectric layer, using a CVD process, to cover the front surface 211, the gate dielectric 222, and the gate electrode 224, and then patterning the dielectric layer using an anisotropic etching process to remove horizontal portions of the dielectric layer, while vertical portions of the dielectric layer on the sidewalls 223 and 225 of the gate dielectric 222 and the gate electrode 224 are left to form the gate spacer 230. In some embodiments, the gate spacer 230 includes oxide or nitride. In some embodiments, the gate spacer 230 includes silicon dioxide or silicon nitride.

Figure 3:
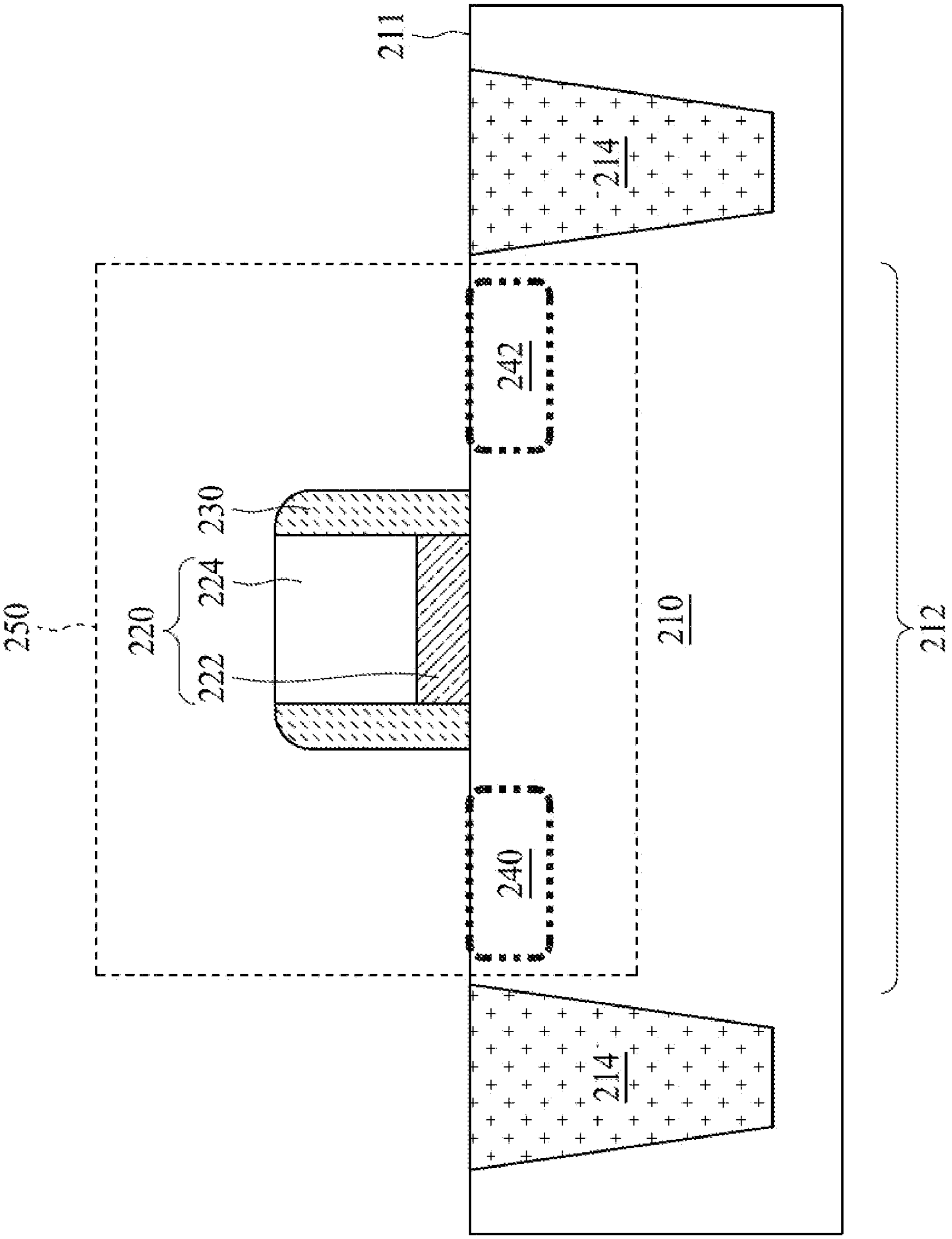

With reference to FIG. 3, in some embodiments, the source region 240 and the drain region 242 may be formed in the substrate 210. In some embodiments, the source region 240 and the drain region 242 are disposed on opposite sides of the gate electrode 224. In some embodiments, the formation process of the source region 240 and the drain region 242 includes forming a photoresist on the front surface 211, and then performing an implantation to form the source region 240 and the drain region 242 in the substrate 210. Accordingly, a metal-oxide-semiconductor (MOS) transistor 250 including the gate electrode 224, the source region 240, and the drain region 242 may be formed. In some embodiments, the source region 240 and the drain region 242 are connected to the front surface 211.

Figure 4:
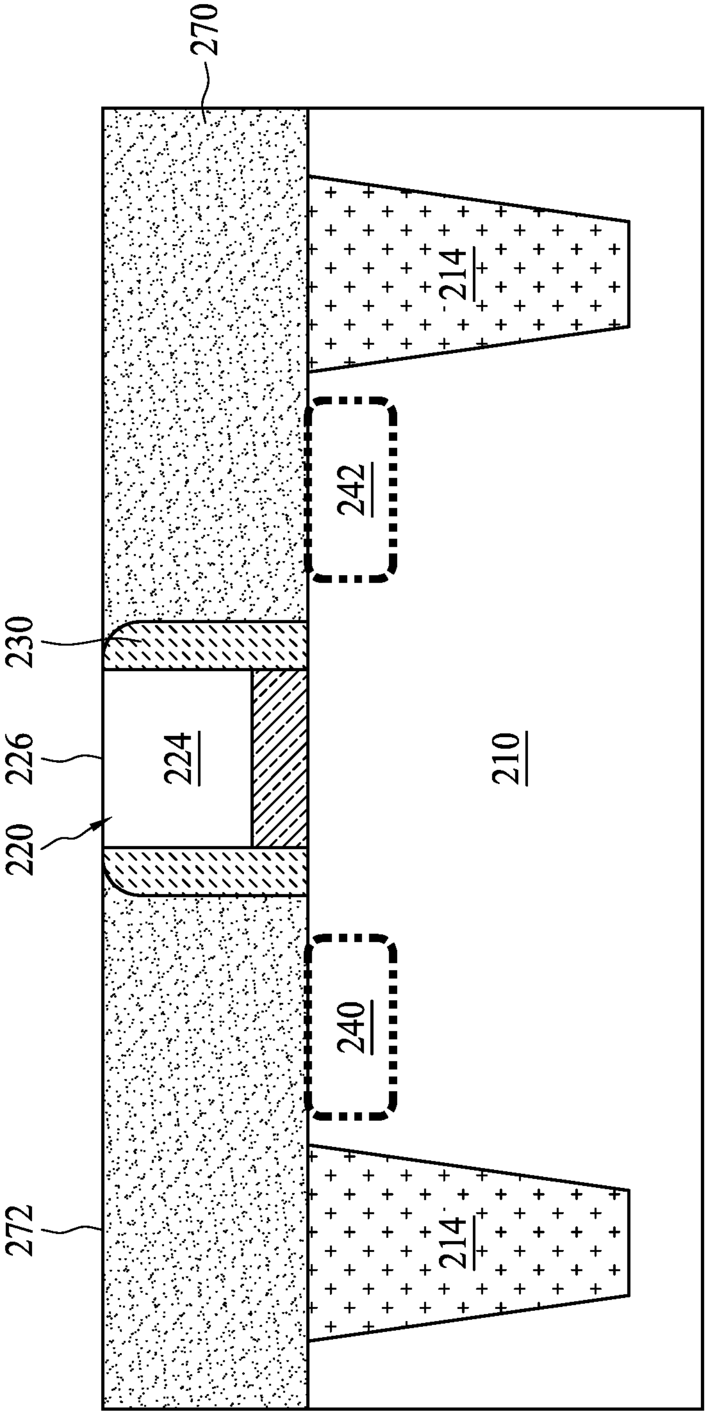

With reference to FIG. 4, in some embodiments, the underlying dielectric layer 270 is deposited over the MOS transistor 250. In some embodiments, the underlying dielectric layer 270 covers the substrate 210, the gate structure 220, and the gate spacer 230. In some embodiments, the underlying dielectric layer 270 includes oxide. In some embodiments, the underlying dielectric layer 270 is a spin-on dielectric layer, using spin-coating technology. In some embodiments, a chemical mechanical polishing (CMP) process is used to provide a planar topography such that a top surface 272 of the underlying dielectric layer 270 is approximately coplanar with an upper surface 226 of the gate electrode 224. In some embodiments, the upper surface 226 of the gate electrode 224 is exposed through the underlying dielectric layer 270.

Figure 5:
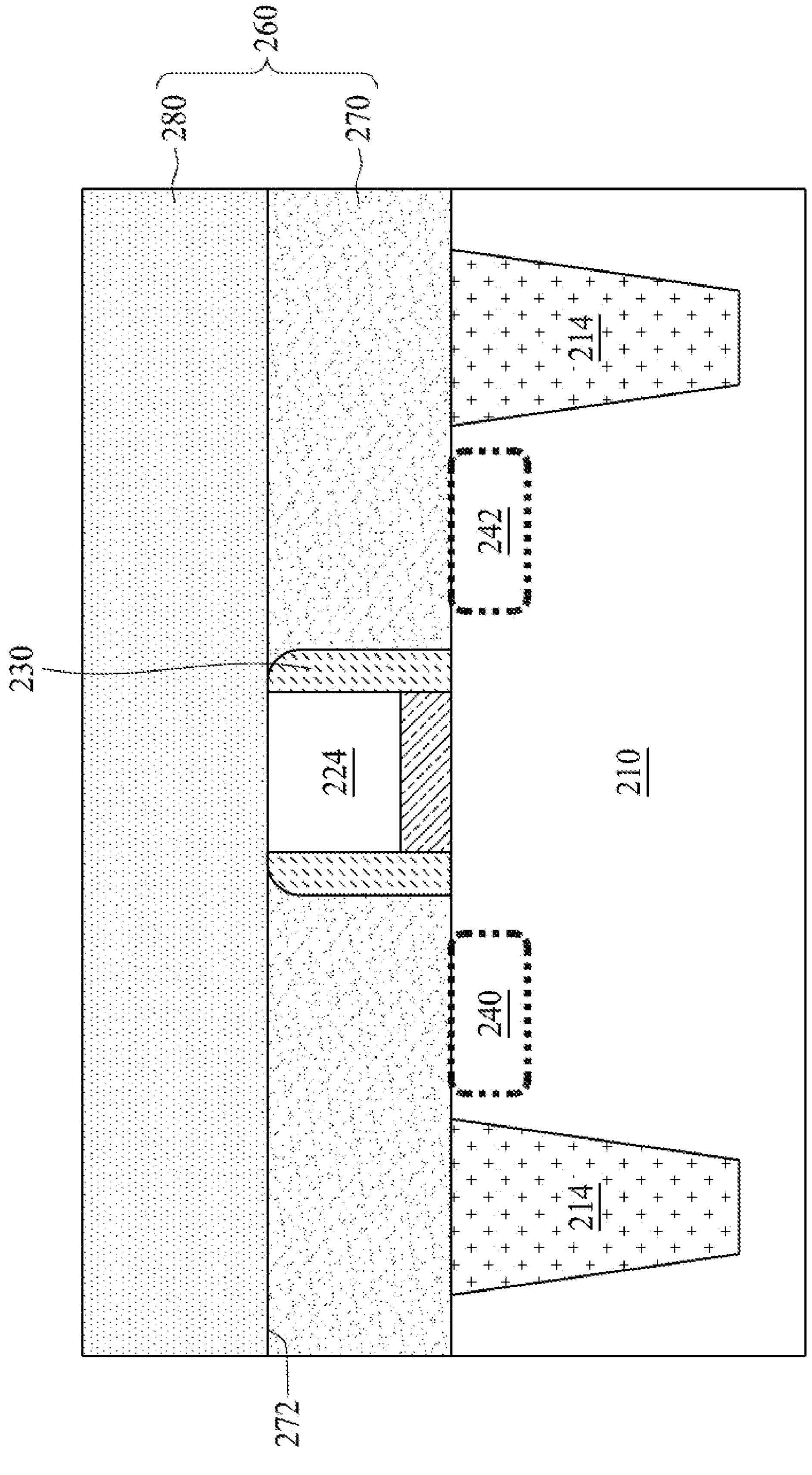

With reference to FIG. 5, in some embodiments, the overlying dielectric layer 280 is deposited over the underlying dielectric layer 270. In some embodiments, the overlying dielectric layer 280 includes oxide. In some embodiments, the overlying dielectric layer 280 covers the underlying dielectric layer 270 and the gate electrode 224. In some embodiments, the overlying dielectric layer 280 may be formed by a CVD process. In some embodiments, the underlying dielectric layer 270 and the overlying dielectric layer 280 may together be referred to as the isolating layer 260.

With reference to FIG. 1 and FIGS. 6 to 11, in step S13, a patterned photoresist 290 may be provided over the overlying dielectric layer 280; a plurality of contact holes 300 may be formed penetrating the overlying dielectric layer 280 and the underlying dielectric layer 270; a metal layer 310 is deposited over the underlying dielectric layer 270, the overlying dielectric layer 280 and in the contact holes 300; and a plurality of metal contacts 320 may be formed in the source region 240, the drain region 242 and the gate electrode 224.

Figure 6:
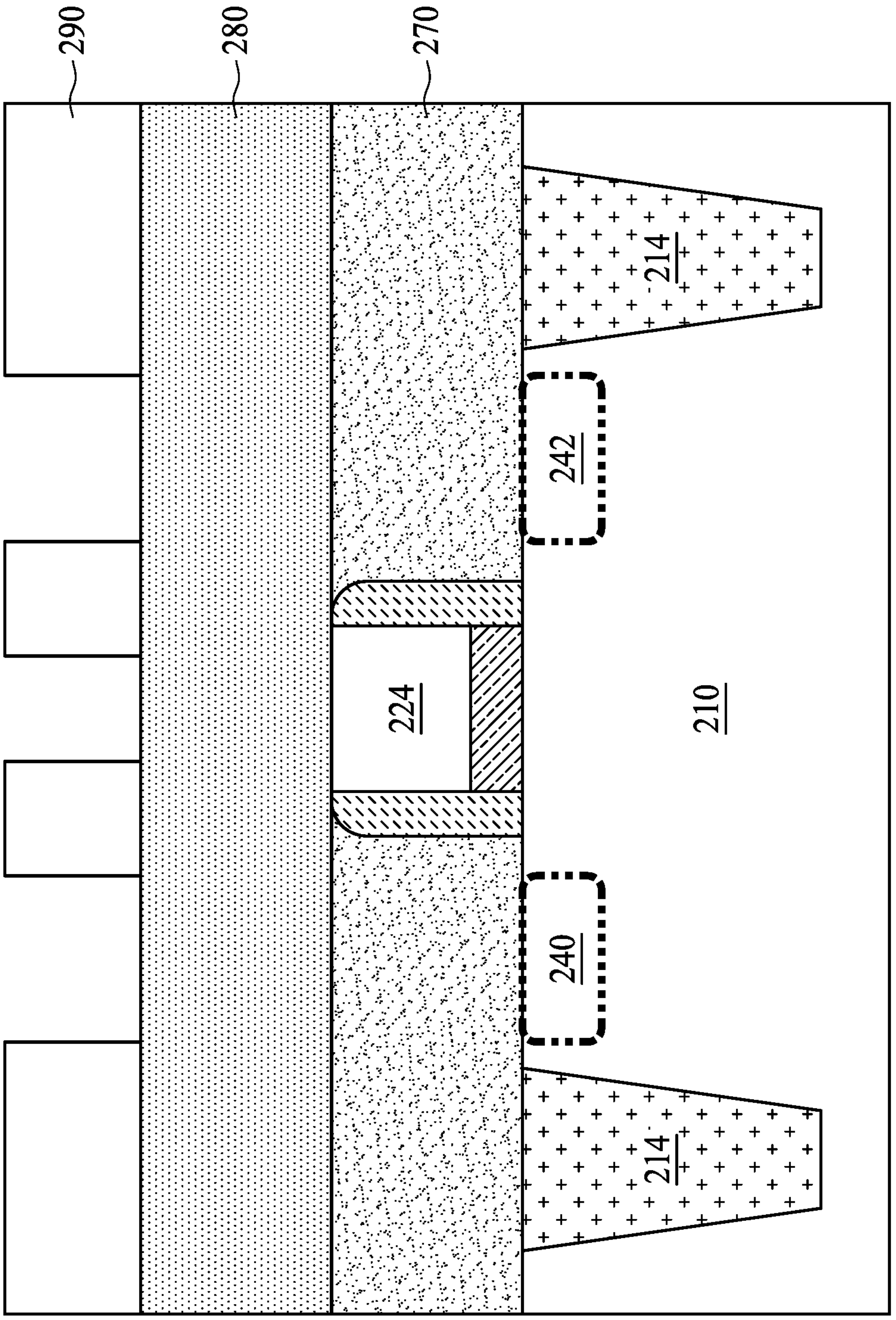

With reference to FIG. 6, in some embodiments, the patterned photoresist 290 may be formed by disposing an unpatterned photoresist layer to fully cover the overlying dielectric layer 280, then removing portions of the unpatterned photoresist layer in accordance with a predefined pattern, wherein a remaining portion of the unpatterned photoresist layer forms the patterned photoresist 290.

Figure 7:
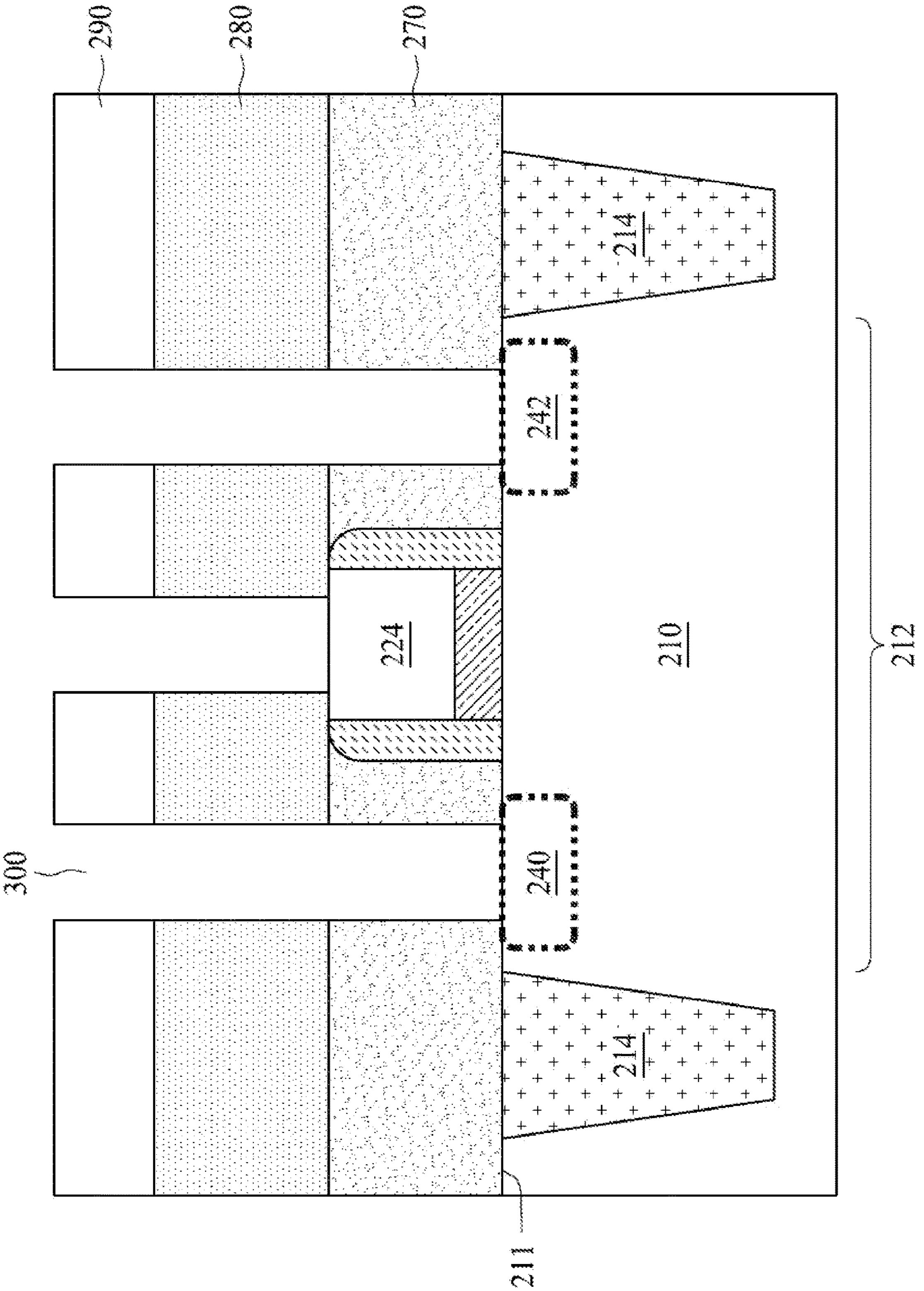
Figure 8:
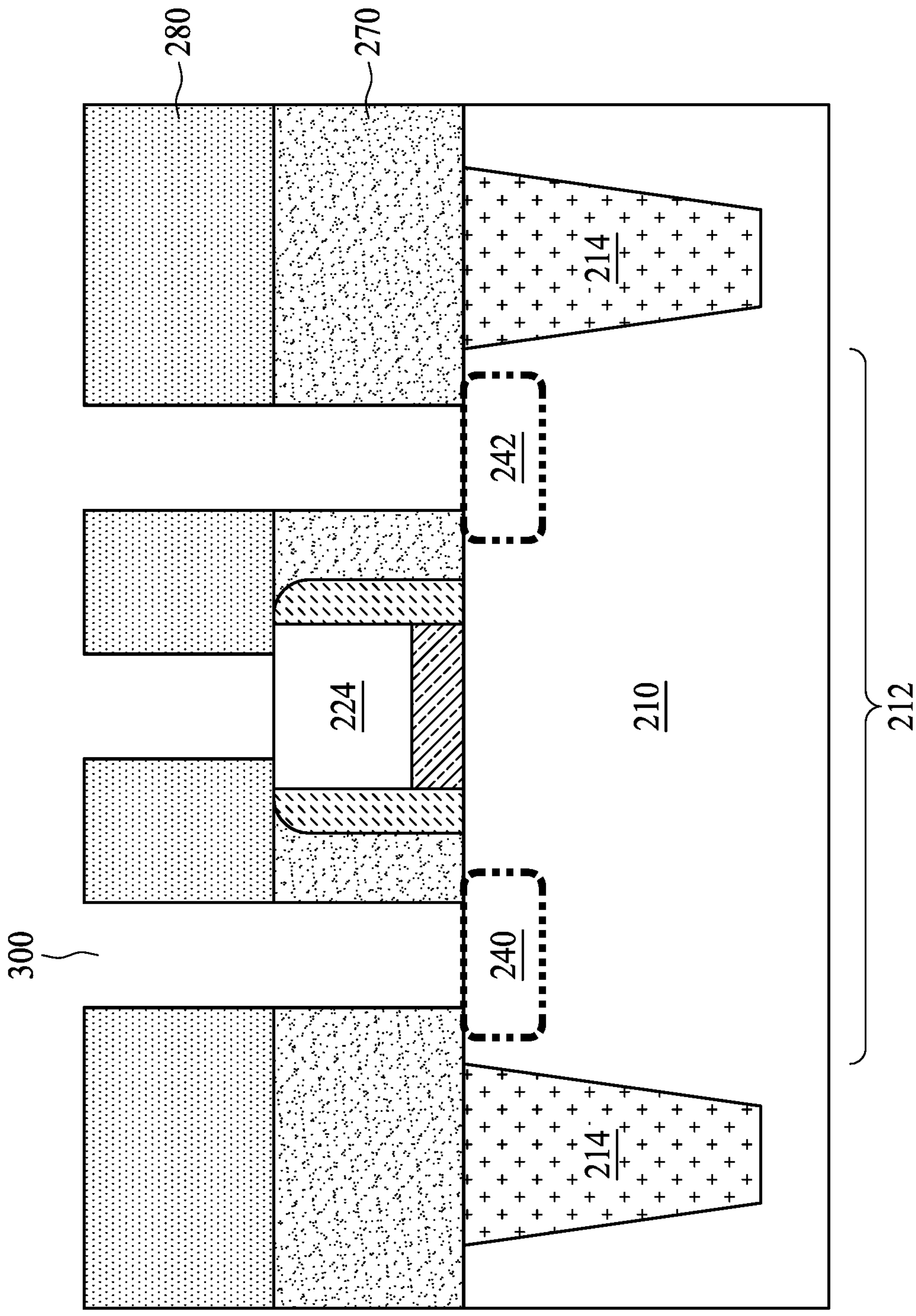

With reference to FIG. 7, an etching process is performed to form the plurality of contact holes 300. In some embodiments, the etching process uses the patterned photoresist 290 to define an area to be etched and to protect other regions of the overlying dielectric layer 280 and the underlying dielectric layer 270. In some embodiments, after the etching process is performed, the overlying dielectric layer 280 and the underlying dielectric layer 270 remain only in portions that are below the patterned photoresist 290. In some embodiments, unnecessary portions of the overlying dielectric layer 280 and the underlying dielectric layer 270 are etched away using the patterned photoresist 290 as a mask. In some embodiments, the contact holes 300 may be formed penetrating through the overlying dielectric layer 280 and the underlying dielectric layer 270. In some embodiments, the contact holes 300 may be formed in the active region 212. In some embodiments, the gate electrode 224 and portions of the front surface 211, connected to the source region 240 and the drain region 242, are exposed to the contact holes 300. In some embodiments, the etching process includes a wet etching process, a dry etching process, or a combination thereof. In some embodiments, the patterned photoresist 290 is removed after the forming of the contact holes 300, as shown in FIG. 8.

Figure 9:
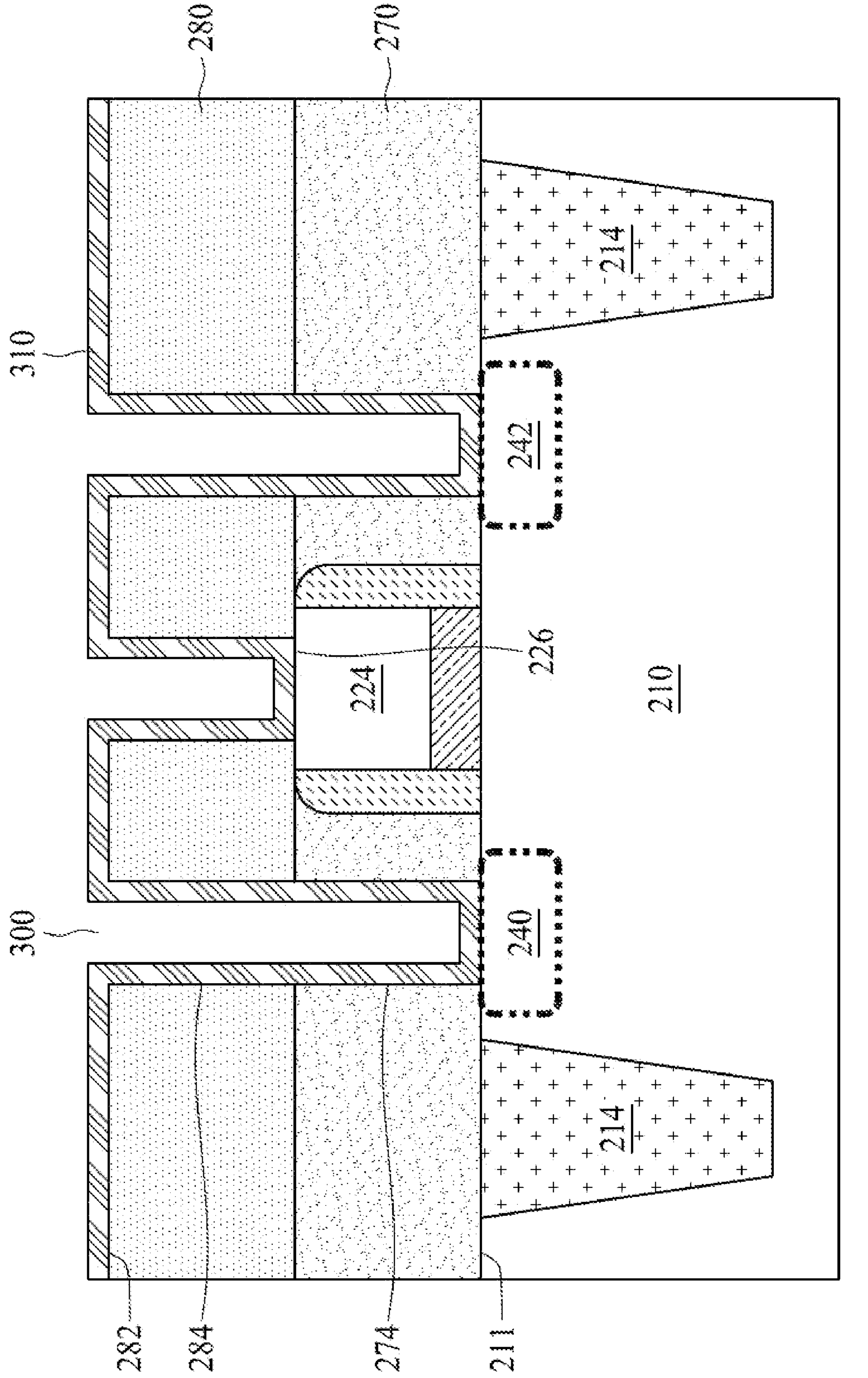

With reference to FIG. 9, in some embodiments, the metal layer 310 is deposited over the underlying dielectric layer 270, the overlying dielectric layer 280 and in the contact holes 300. In some embodiments, the metal layer 310 is disposed on the upper surface 226 of the gate electrode 224, on a sidewall 274 of the underlying dielectric layer 270, on a sidewall 284 of the overlying dielectric layer 280, and on a top surface 282 of the overlying dielectric layer 280. In some embodiments, the metal layer 310 has a uniform thickness. In some embodiments, the metal layer 310 includes titanium. In some embodiments, the metal layer 310 includes cobalt.

Figure 10:
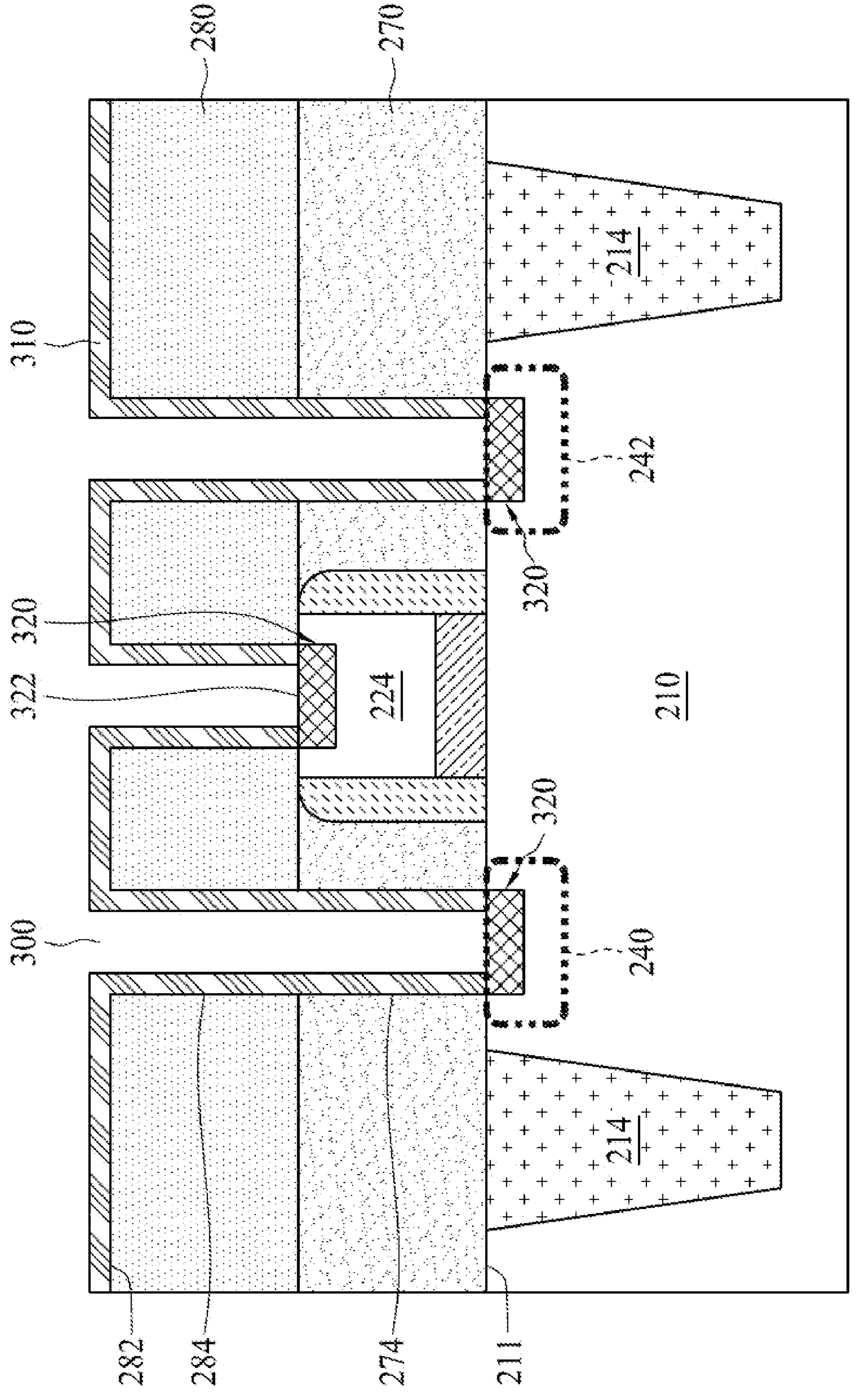
Figure 11:
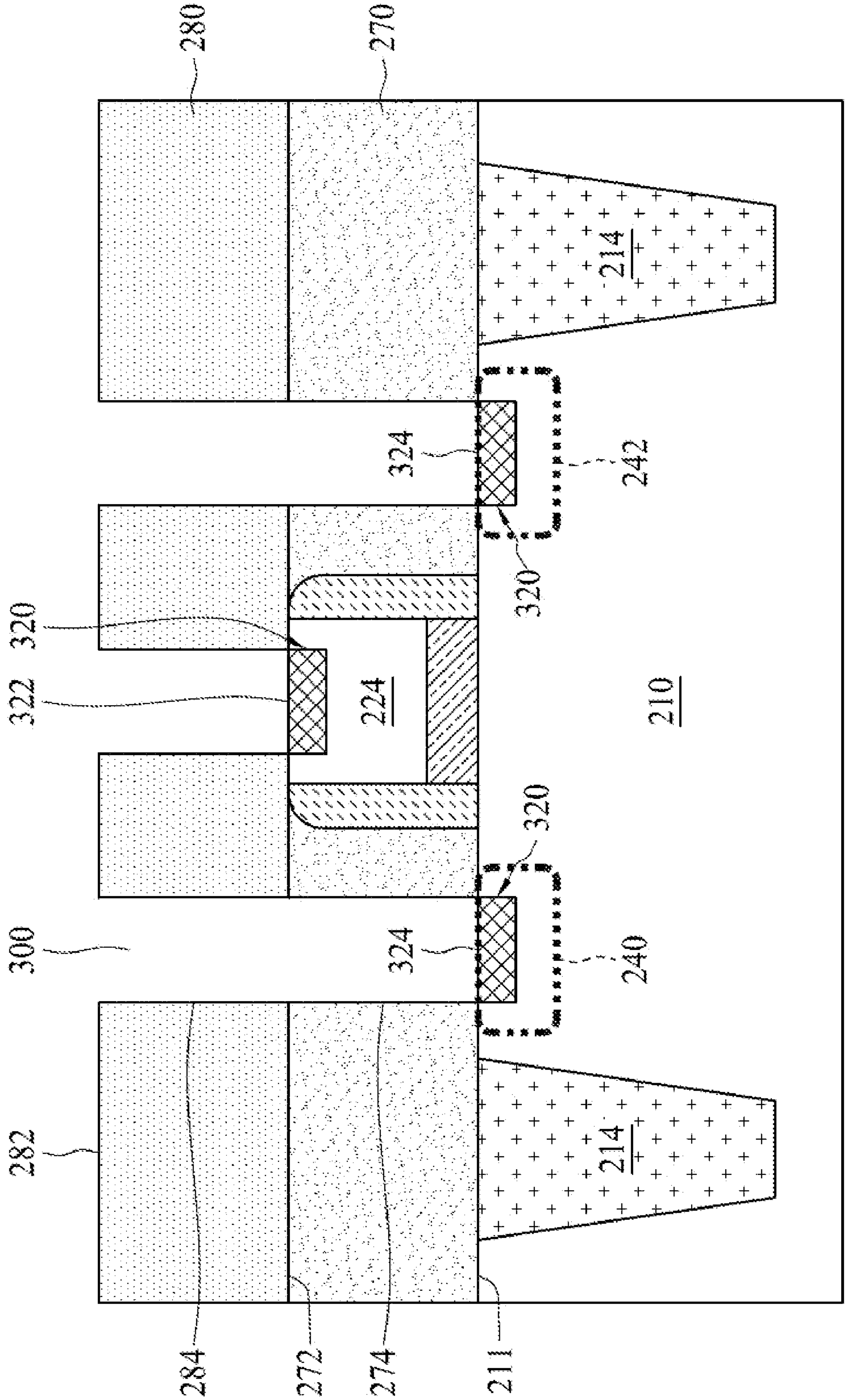

With reference to FIGS. 10 and 11, a thermal process is performed to at least make portions of the metal layer 310 react with the gate electrode 224 and the substrate 210 in the source region 240 and the drain region 242 to form the plurality of metal contacts 320. In some embodiments, the metal contacts 320 are metal silicide contacts. In some embodiments, the thermal process utilized to form the metal contacts 320 is preferably a rapid thermal annealing (RTA) process. In some embodiments, after the forming of the metal contacts 320, an unreacted portion of the metal layer 310, disposed over the top surface 282 and on the sidewalls 274 and 284, is removed using a wet etching process, as shown in FIG. 11.

With reference to FIG. 11, in some embodiments, the metal contact 320 located in the gate electrode 224 may be formed by reacting the metal layer 310 with the gate electrode 224, while the metal contacts 320 located in the source region 240 and the drain region 242 may be formed by reacting the metal layer 310 with the substrate 210. In some embodiments, the metal contacts 320 include titanium silicide or cobalt silicide, wherein the cobalt silicide has a contact resistance lower than that of the titanium silicide. In some embodiments, a top surface 322 of the metal contact 320 buried in the gate electrode 224 is coplanar with the top surface 272 of the underlying dielectric layer 270. In some embodiments, top surfaces 324 of the metal contacts 320 buried in the source region 240 and the drain region 242 are coplanar with the front surface 211. In some embodiments, the metal silicide contacts provide greater electrical conductivity than contacts without silicide, at the interfaces between the substrate 210 and conductive plugs (as described below) and between the gate electrode 224 and the conductive plugs.

With reference to FIG. 1 and FIGS. 12 to 16, in step S15, a contact liner 330 may be formed in the contact holes 300, a barrier layer 335 is optionally formed in the contact holes 300, and a plurality of conductive plugs 350 may be formed in the contact holes 300 and surrounded by the contact liner 330.

Figure 12:
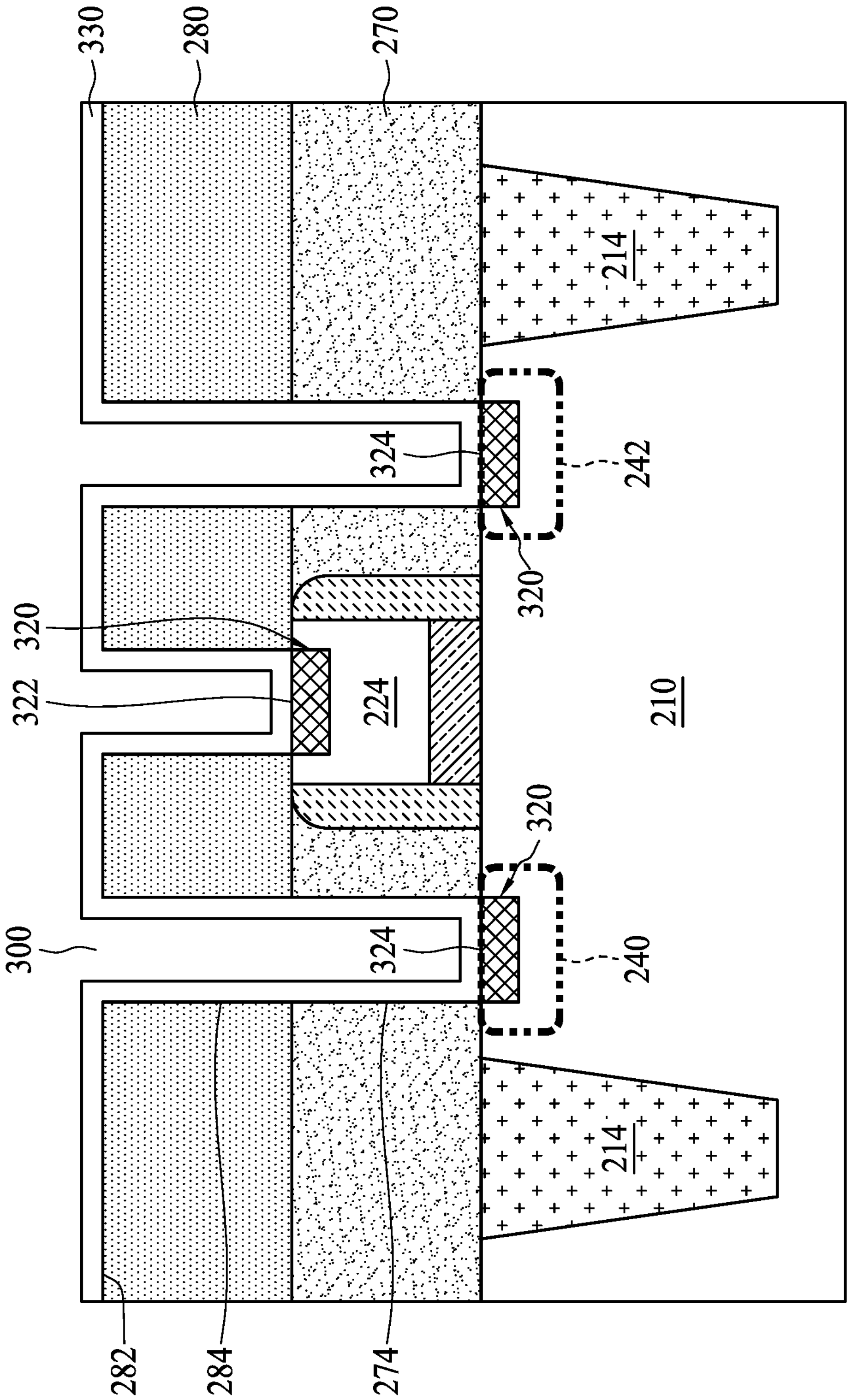

With reference to FIG. 12, in some embodiments, a contact liner 330 is deposited over the overlying dielectric layer 280 and in the contact holes 300. In some embodiments, the contact liner 330 is disposed on the top surface 282 of the overlying dielectric layer 280, top surfaces 322 and 324 of the metal contacts 320, and on the sidewalls 274 and 284 of the underlying dielectric layer 270 and the overlying dielectric layer 280. In some embodiments, the contact liner 330 has a uniform thickness. In some embodiments, the contact liner 330 includes nitride. In some embodiments, the contact liner 330 includes silicon nitride.

Figure 13:
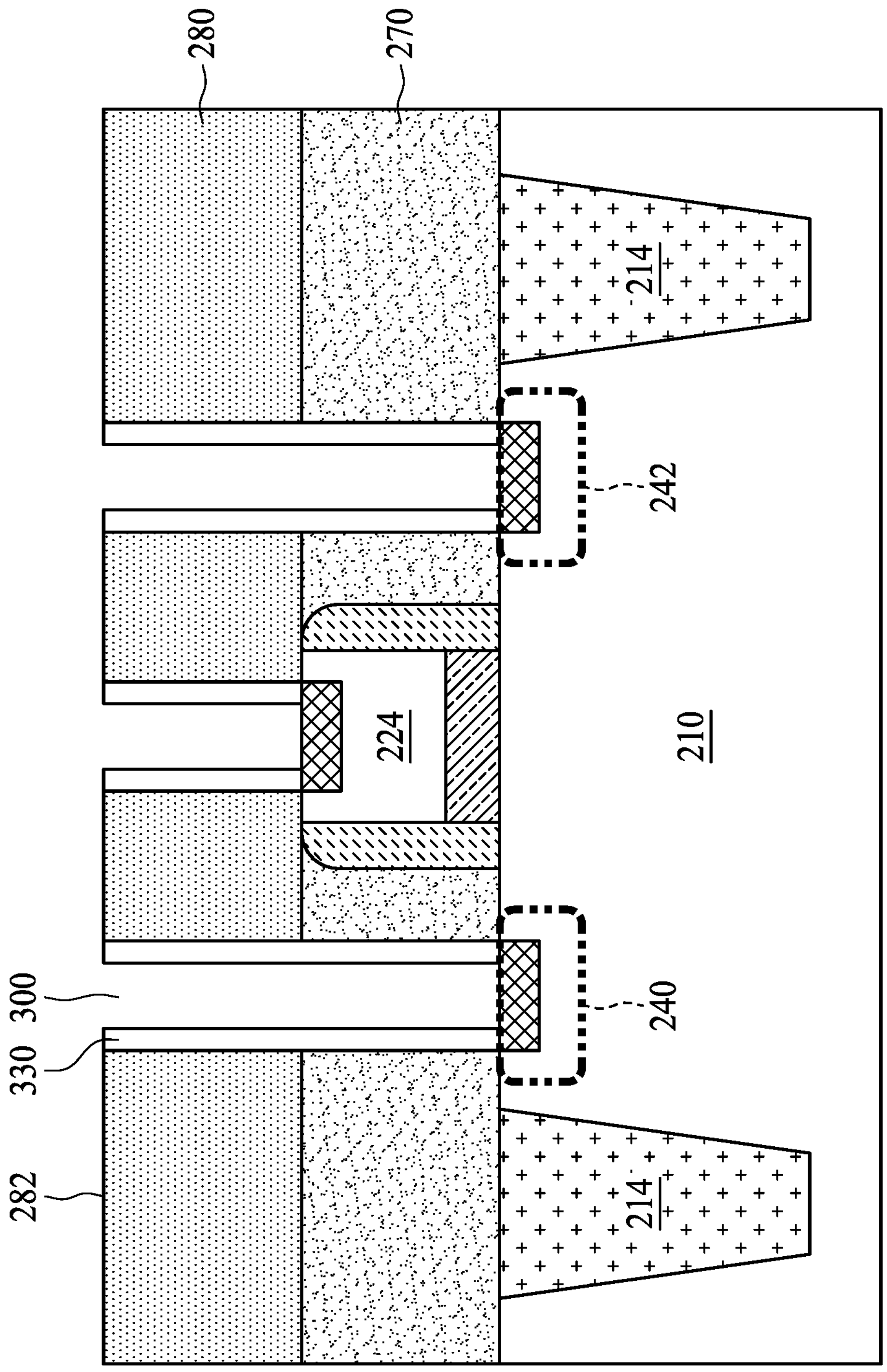

With reference to FIGS. 12 and 13, in some embodiments, a portion of the contact liner 330 is removed. In some embodiments, the portion of the contact liner 330 disposed on the top surface 282 and on the metal contacts 320 is removed, while the portion of the contact liner 330 disposed on the sidewalls 274 and 284 is left in place. In some embodiments, the portion of the contact liner 330 is removed using an anisotropic etching process. In some embodiments, the top surface 282 and the metal contacts 320 are exposed through the contact liner 330 after the performing of the etching process. In some embodiments, the remaining portion of the contact liner 330 is used for reducing a diameter of each of the contact holes 300 for forming conductive plugs, as described below. Specifically, the contact holes 300 for depositing the conductive plug are initially formed with a diameter greater than that stipulated in the design rule or design guide, in order to allow for fabrication of the metal contacts 320, and the contact liner 330 is subsequently used for reducing the diameter of the contact holes 330 in order to meet the requirement of the design rule or design guide.

Figure 14:
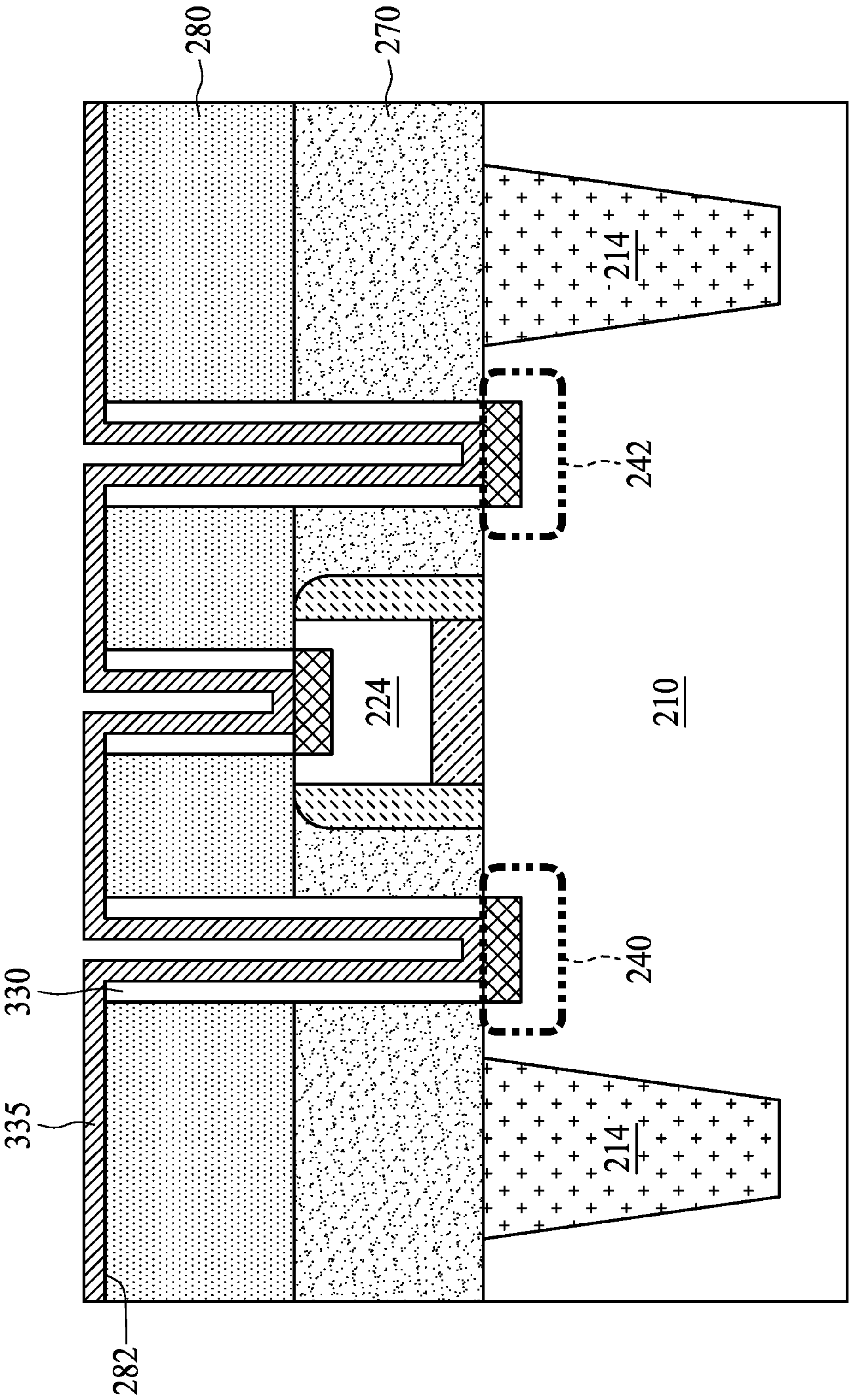

With reference to FIG. 14, in some embodiments, the barrier layer 335 is optionally deposited over the overlying dielectric layer 280 and in the contact holes 300, wherein the barrier layer 335 is surrounded by the contact liner 330. In some embodiments, the barrier layer 335 has a uniform thickness. In some embodiments, the barrier layer 335 covers the top surface 282 of the overlying dielectric layer 280 and the contact liner 330. In some embodiments, the barrier layer 335 includes titanium.

Figure 15:
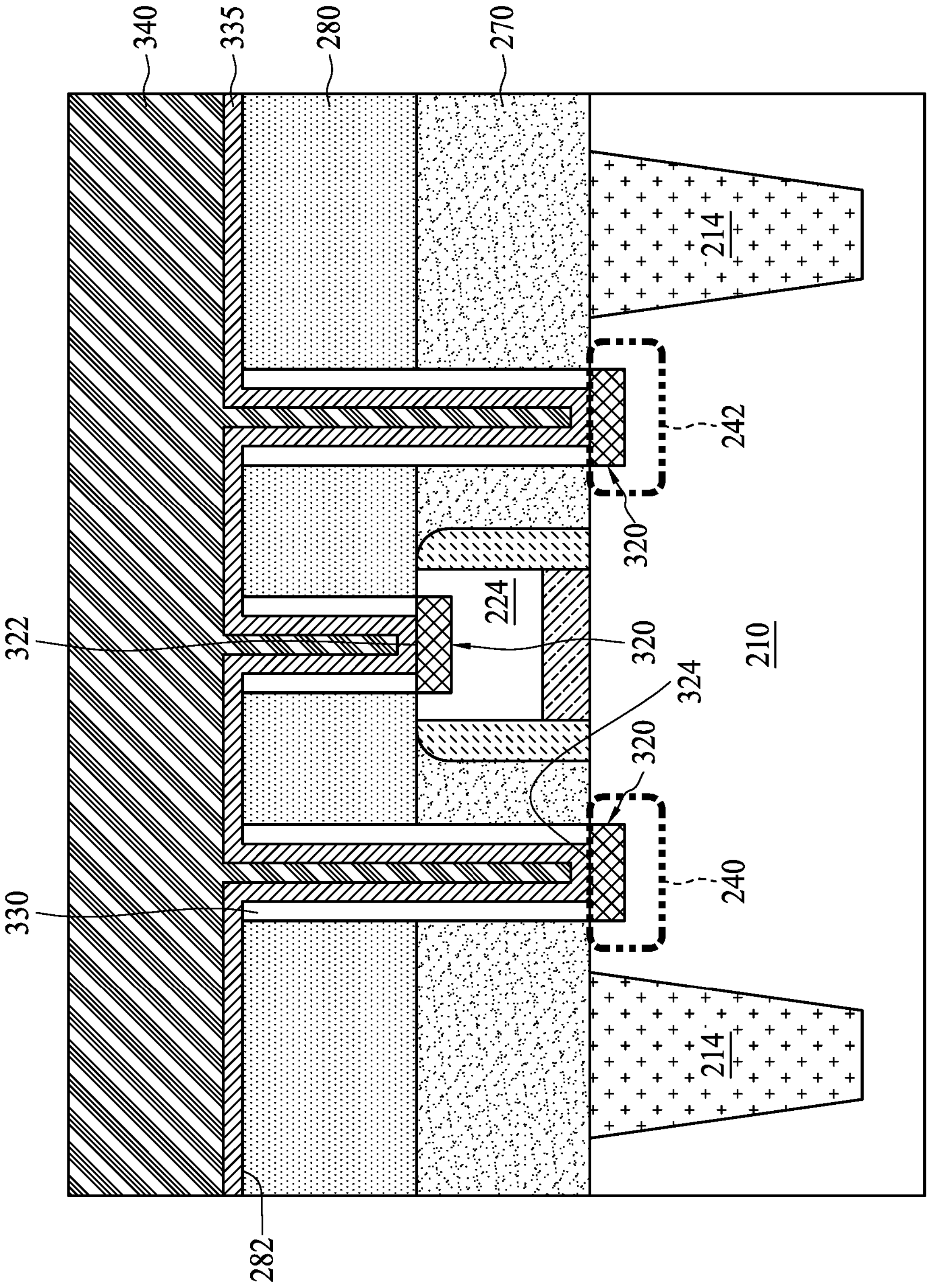

With reference to FIGS. 14 and 15, in some embodiments, a conductive material 340 is deposited over the barrier layer 335 and in the contact holes 300. In some embodiments, the conductive material 340 has a thickness sufficient to fill the contact holes 300. In some embodiments, the conductive material 340 includes tungsten. In some embodiments, the conductive material 340 includes copper. In some embodiments, the conductive material 340 is electrically coupled to the metal contacts 320 through the barrier layer 335.

Figure 16:
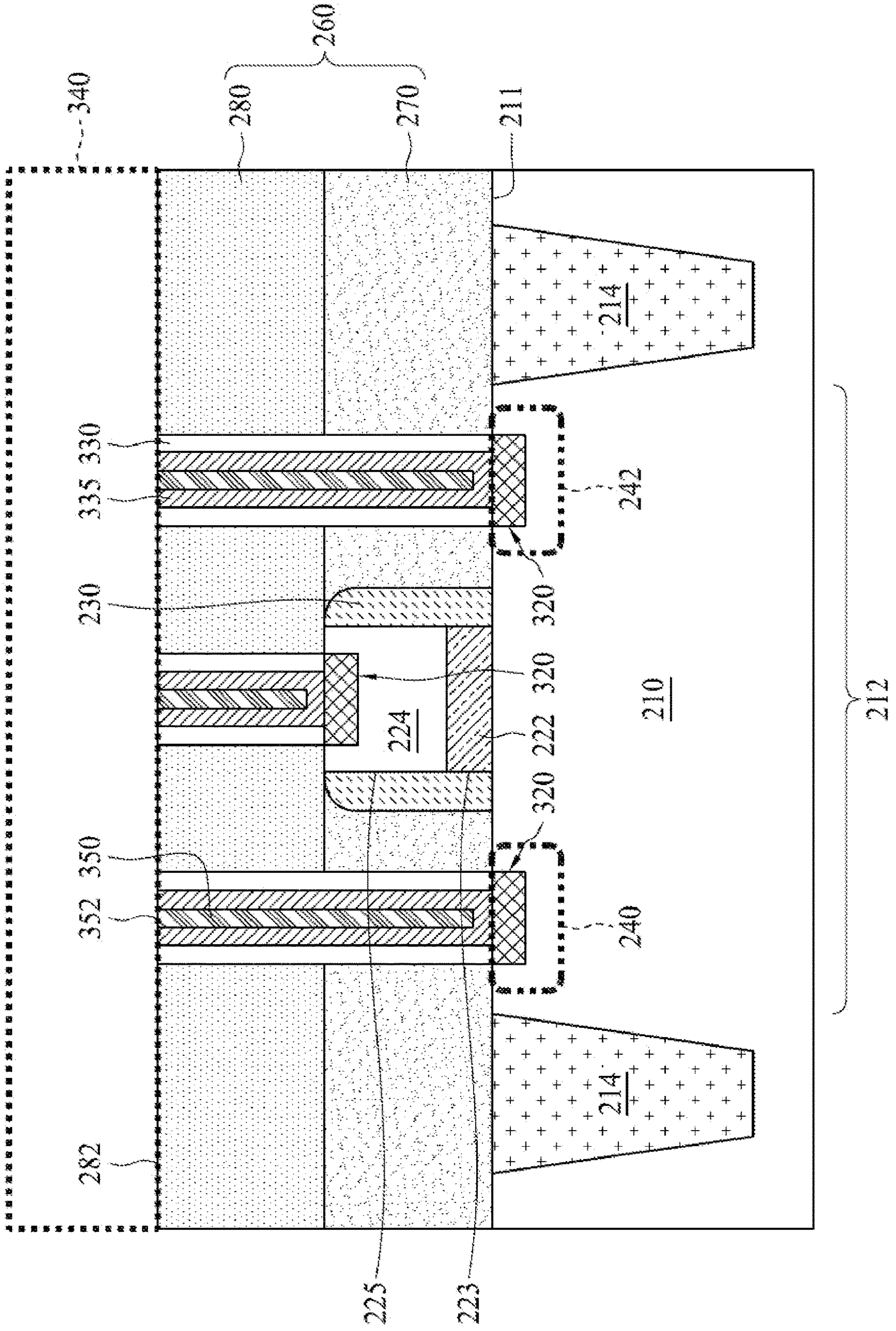

With reference to FIG. 16, in some embodiments, a planarizing process is performed. In some embodiments, the planarizing process is performed to remove excess portions of the conductive material 340 over the top surface 282, while remaining portions of the conductive material 340 form a plurality of conductive plugs 350 surrounded by the contact liner 340. In some embodiments, an end surface 352 of each of the conductive plugs 350 is coplanar with the top surface 282, and another end surface 354 of each of the conductive plugs 350 is electrically coupled to the metal contact 320 through the barrier layer 335. In some embodiments, the planarizing process includes a chemical mechanical polishing (CMP) process.

With reference to FIG. 1 and FIGS. 17 to 20, in step S17, a hard mask 410 may be provided, a filling layer 401 may be formed in the overlying dielectric layer 280, and an air gap 301 may be formed in the filling layer 401.

Figure 17:
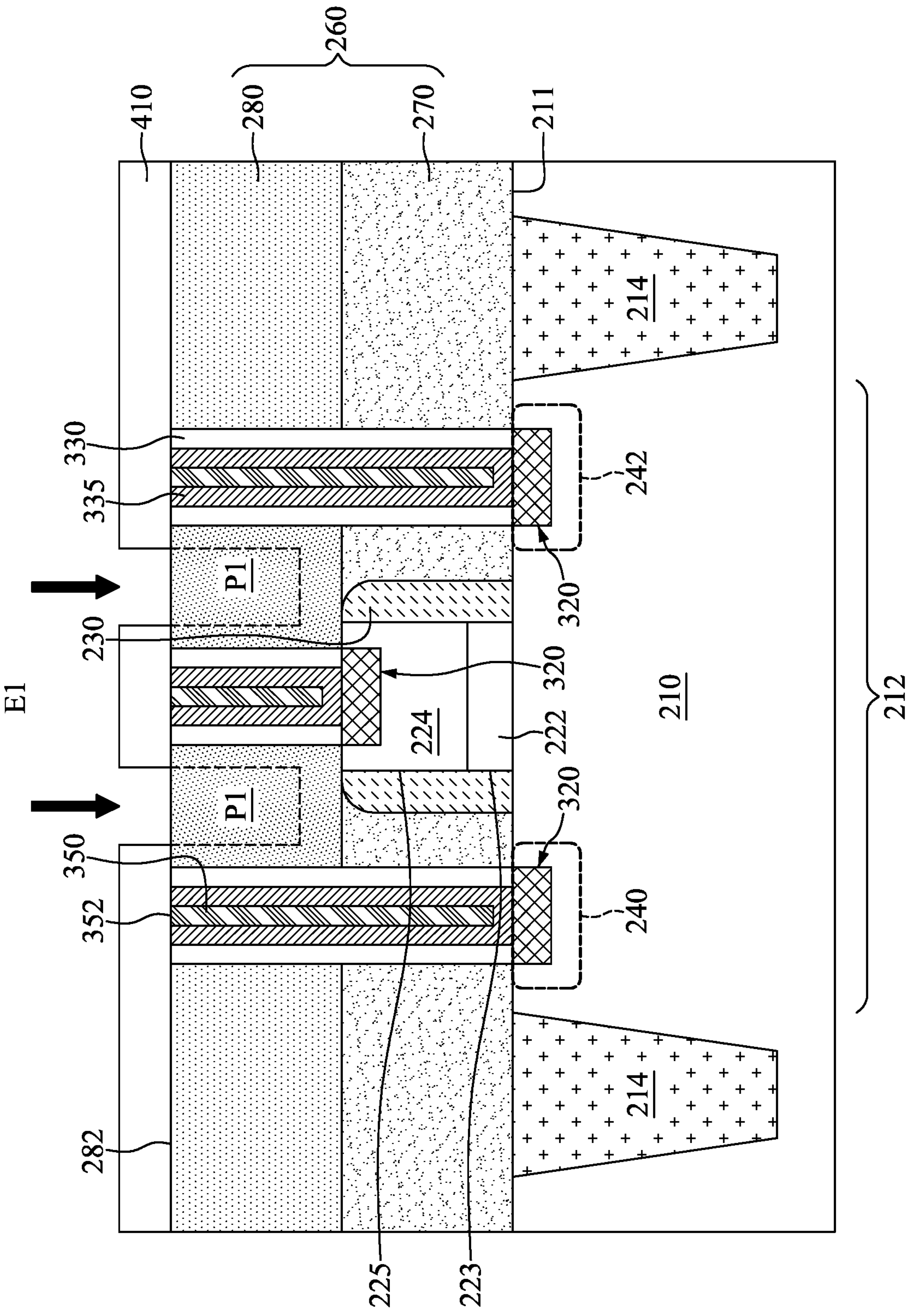

With reference to FIG. 17, in some embodiments, the hard mask 410 may be provided over the isolating layer 260. In some embodiments, an etching process E1 is performed using the hard mask 410 as an etch mask. In some embodiments, the hard mask 410 may be formed by disposing a hard mask material over the overlying dielectric layer 280, the contact liner 330, the barrier layer 335 and the conductive plugs 350 and then providing a patterned mask (not shown), for example, a patterned photoresist with a predefined pattern over the hard mask material. Sequentially, a photolithography process including an exposure process, a post bake process and a develop process is performed on the patterned photoresist, and a hard mask etching process is performed on the hard mask material using the developed photoresist as a mask. Accordingly, the hard mask 410 with the predefined pattern may be formed. In some embodiments, the hard mask material may be a material having an etching selectivity to the overlying dielectric layer 280. In some embodiments, the hard mask material may be, for example, silicon oxide, silicon nitride, silicon oxynitride, or silicon nitride oxide. In some embodiments, the patterned mask (i.e., the patterned photoresist) is removed after the hard mask is formed.

In some embodiments, the etching process E1 is performed using the hard mask 410 as an etch mask. In some embodiments, a portion P1 (indicated in FIG. 17 by a dotted line) of the overlying dielectric layer 280 is removed by the etching process E1. In some embodiments, the etching process E1 may be a wet etching process, a dry etching process, or a combination thereof. In some embodiments, the hard mask 410 is removed after the etching process E1 is performed.

Figure 18:
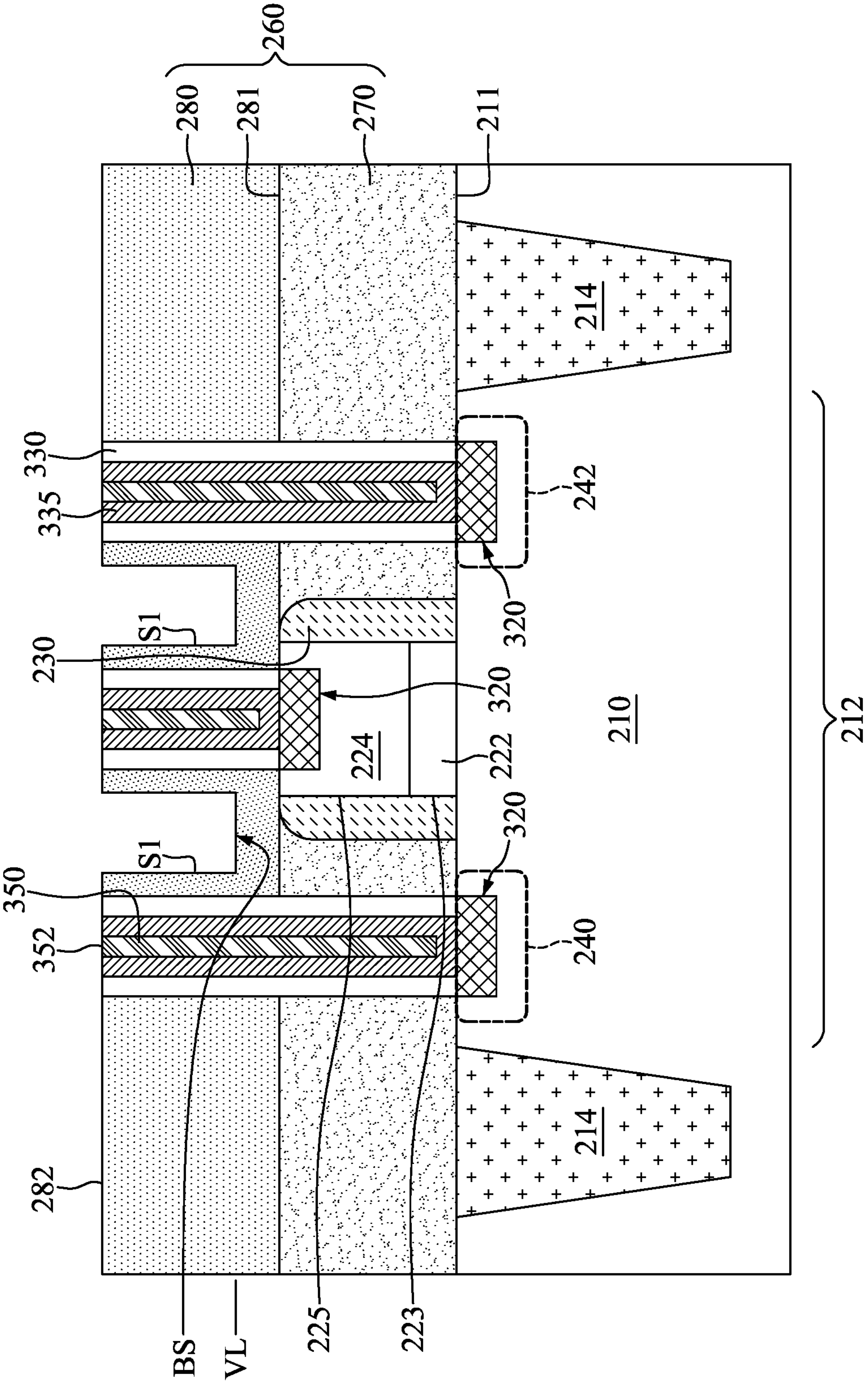

With reference to FIG. 18, in some embodiments, a space S1 may be formed after the removal of the portion P1 of the overlying dielectric layer 280. In some embodiments, a bottom surface BS of the space S1 may be at a vertical level VL higher than a bottom surface 281 of the overlying dielectric layer 280.

Figure 19:
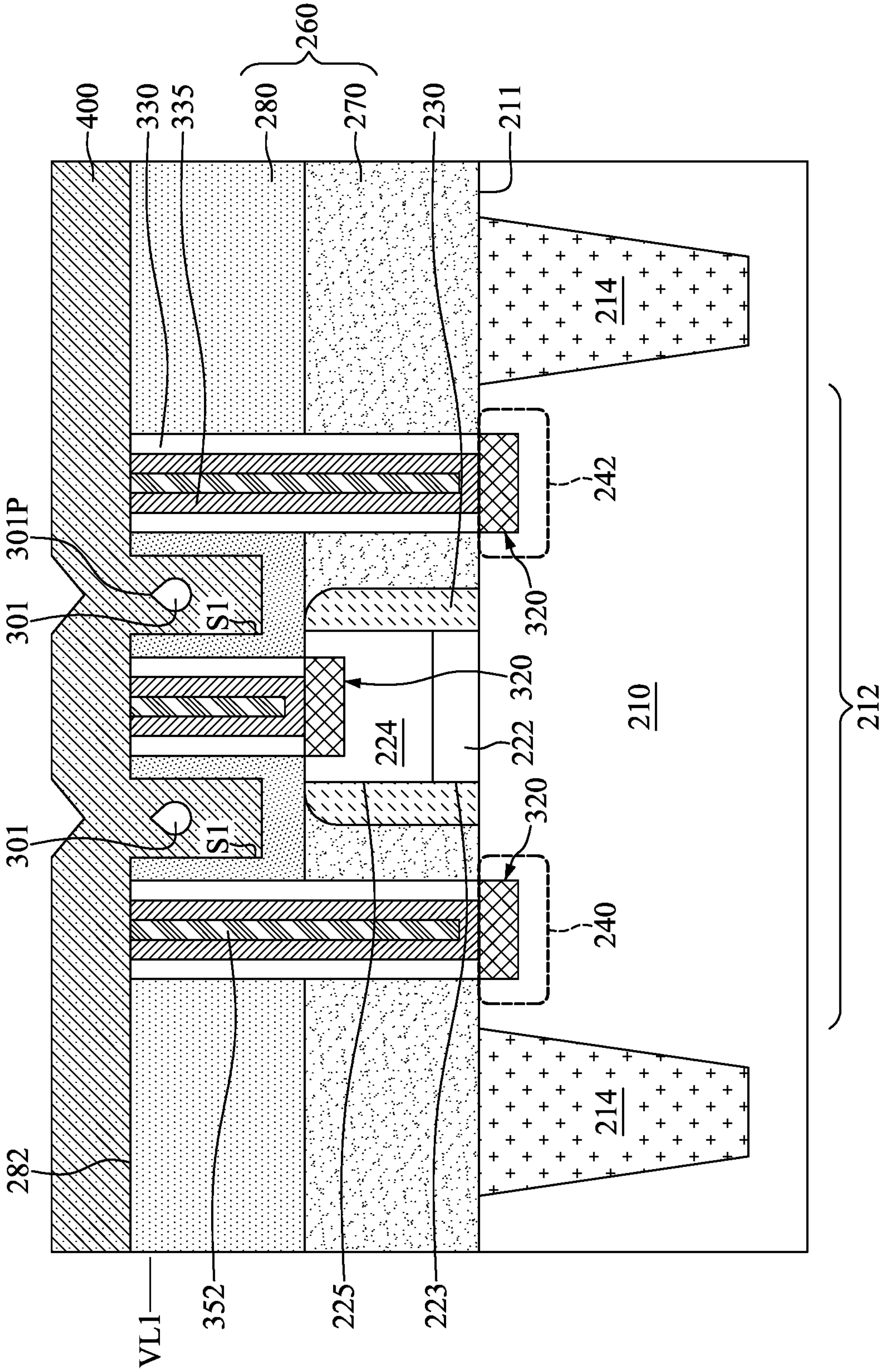

With reference to FIG. 19, in some embodiments, a layer of filling material 400 may be formed to cover the top surface 282 of the overlying dielectric layer 280 and to partially fill the space S1 in the overlying dielectric layer 280. A remaining empty portion of the space S1 may be referred to as the air gap 301. For example, the layer of filling material 400 may be formed with a higher deposition rate near top corners of the overlying dielectric layer 280 adjacent to the space S1. As a result, the filling material 400 near the top corners of the overlying dielectric layer 280 adjacent to the space S1 may be firstly sealed to create the air gap 301. In some embodiments, a top portion 301P of the air gap 301 may be at a vertical level VL1 lower than the top surface 282 of the overlying dielectric layer 280. In some embodiments, the filling material 400 may include boron carbonitride.

In some embodiments, a pre-treatment process may be applied to the space S1 before the formation of the layer of filling material 400. Due to the pre-treating of the surface of the space S1, adhesion of the layer of filling material 400 may be improved by producing a favorable interface between the surface of the space S1 (e.g., the exposed surface of the overlying dielectric layer 280) and the layer of filling material 400. The pre-treatment process may be or may include a thermal process or a plasma-enhanced process. Processing conditions may be maintained during the formation of the layer of filling material 400, as discussed below, which may facilitate the formation of the layer of filling material 400. In some embodiments, the pre-treatment process may include delivery of a hydrogen-containing precursor, a nitrogen-containing precursor, or some other precursor. Exemplary precursors may include hydrogen, ammonia, or other hydrogen-containing or nitrogen-containing precursors, among other materials that may be used to pre-treat the surface of the space S1.

In some embodiments, the formation of the layer of filling material 400 may include providing a first precursor to the surface of the space S1, generating a capacitively-coupled plasma of the first precursor, and forming the layer of filling material 400.

In some embodiments, the first precursor may include boron, carbon, and/or nitrogen. Non-limiting exemplary precursors may be or may include tris(dimethylamino) borane, dimethylamine borane, trimethylamine borane, triethylamine borane, tetrakis(dimethylamino)diborane, or any other precursor including one or more of boron, carbon, and/or nitrogen. Additional precursors may be included in some embodiments to adjust atomic ratios. For example, additional hydrogen-containing precursors, carbon-containing precursors such as a hydrocarbon molecule, or nitrogen-containing precursors such as nitrogen gas and ammonia, may be included along with carrier or inert gases, such as helium, neon, argon, krypton, xenon, or nitrogen.

In some embodiments, co-reactants may be included during the formation of the layer of filling material 400. The co-reactants may include carbon dioxide, carbon monoxide, water, methanol, oxygen, ozone, nitrous oxide, or a combination thereof. Such materials may be used as nitriding agents, oxidizers, reductants, etc. In some embodiments, the co-reactants can be used to adjust an amount of carbon in the layer of filling material 400. In some cases, the co-reactants can be used to adjust an amount of nitrogen or oxygen in the layer of filling material 400. In some embodiments, the co-reactants may be introduced along with the first precursor, e.g., without direct exposure to the plasma.

A plasma power at which the process is performed may affect growth of the layer (i.e., the layer of filling material 400), as well as a variety of properties of the layer. For example, carbon incorporation within the layer may allow a dielectric constant to be reduced by incorporating additional methyl groups within the layer. However, during plasma processing, methyl moieties may be decomposed relatively easily, and carbon may then simply be exhausted from a process chamber. Additionally, as the plasma power increases, bombardment of the layer may increase, which may remove pores and densify the layer, and which may further increase the dielectric constant of the layer. Accordingly, in some embodiments, the plasma may be generated at a plasma power of less than or about 500 W, and may be generated at less than or about 450 W, less than or about 400 W, less than or about 350 W, less than or about 300 W, less than or about 250 W, less than or about 200 W, less than or about 150 W, less than or about 100 W, less than or about 50 W, or less.

Similarly, a pressure at which the process may be performed may affect aspects of the process as well. For example, as pressure increases, absorption of atmospheric water may increase, which may increase the dielectric constant of the layer. As lower pressures are maintained, hydrophobicity of the layer may increase. Accordingly, in some embodiments, the pressure may be maintained at less than or about 10 Torr in order to produce a sufficiently low dielectric constant, and the pressure may be maintained at less than or about 9 Torr, less than or about 8 Torr, less than or about 7 Torr, less than or about 6 Torr, less than or about 5 Torr, less than or about 4 Torr, less than or about 3 Torr, less than or about 2 Torr, less than or about 1 Torr, less than or about 0.5 Torr, or less. However, to maintain plasma parameters to facilitate layer formation, the pressure may be maintained above or about 0.5 Torr, and may be maintained above or about 1 Torr, or greater.

In some embodiments, a process temperature during the formation of the layer of filling material 400 may be maintained at a temperature below or about 500° C., and in some embodiments may be maintained at less than or about 475° C., less than or about 450° C., less than or about 425° C., less than or about 400° C., less than or about 375° C., less than or about 350° C., less than or about 325° C., less than or about 300° C., less than or about 275° C., less than or about 250° C., less than or about 225° C., less than or about 200° C., less than or about 175° C., less than or about 150° C., less than or about 125° C., less than or about 100° C., less than or about 75° C., or less.

In some embodiments, a boron concentration of the layer of filling material 400 may be greater than or about 30%, and may be greater than or about 32%, greater than or about 34%, greater than or about 36%, greater than or about 38%, greater than or about 40%, greater than or about 42%, greater than or about 44%, greater than or about 46%, or greater. Similarly, a carbon concentration of the layer of filling material 400 may be greater than or about 12%, and may be greater than or about 14%, greater than or about 16%, greater than or about 18%, greater than or about 20%, greater than or about 22%, greater than or about 24%, greater than or about 26%, greater than or about 28%, greater than or about 30%, or greater. A nitrogen concentration of the layer of filling material 400 may be greater than or about 20%, and may be greater than or about 22%, greater than or about 24%, greater than or about 26%, greater than or about 28%, greater than or about 30%, greater than or about 32%, greater than or about 34%, greater than or about 36%, greater than or about 38%, or more. Once exposed to atmosphere, the layer of filling material 400 may include any amount of oxygen incorporation, which may be maintained at less than or about 15%, and may be maintained at less than or about 14%, less than or about 13%, less than or about 12%, less than or about 11%, less than or about 10%, less than or about 9%, less than or about 8%, or less.

While carbon or methyl groups may facilitate a lower dielectric constant within the layer of filling material 400, a boron-to-nitrogen ratio within the film may affect a layer hardness and modulus. Accordingly, in some embodiments, the boron-to-nitrogen ratio may be maintained at greater than or about 1:1, and may be maintained at greater than or about 1.2:1, greater than or about 1.4:1, greater than or about 1.6:1, greater than or about 1.8:1, greater than or about 2:1, or greater. A carbon-to-boron ratio may also facilitate the beneficial properties of the layer of filling material 400. For example, carbon incorporation may detrimentally impact layer hardness in a general sense, although when carbon is sufficiently bonded with boron based on the layer growth characteristics, hardness and modulus may be improved.

In some embodiments, the dielectric constant of the layer of filling material 400 may be less than or about 4.0, less than or about 3.9, less than or about 3.8, less than or about 3.7, less than or about 3.6, less than or about 3.5, less than or about 3.4, less than or about 3.3, less than or about 3.2, less than or about 3.1, less than or about 3.0, less than or about 2.9, less than or about 2.8, or less.

In some embodiments, the Young's modulus of the layer of filling material 400 may be maintained at greater than or about 40 GPa, and may be maintained at greater than or about 42 GPa, greater than or about 44 GPa, greater than or about 46 GPa, greater than or about 48 GPa, greater than or about 50 GPa, greater than or about 52 GPa, greater than or about 54 GPa, greater than or about 56 GPa, greater than or about 58 GPa, greater than or about 60 GPa, greater than or about 62 GPa, or greater. In some embodiments, a layer hardness of the layer of filling material 400 may be maintained at greater than or about 4.0 GPa, and may be maintained at greater than or about 4.1 GPa, greater than or about 4.2 GPa, greater than or about 4.3 GPa, greater than or about 4.4 GPa, greater than or about 4.5 GPa, greater than or about 4.6 GPa, greater than or about 4.7 GPa, greater than or about 4.8 GPa, or greater. Such properties may be produced without additional treatment, such as UV irradiation or other processes.

Figure 20:
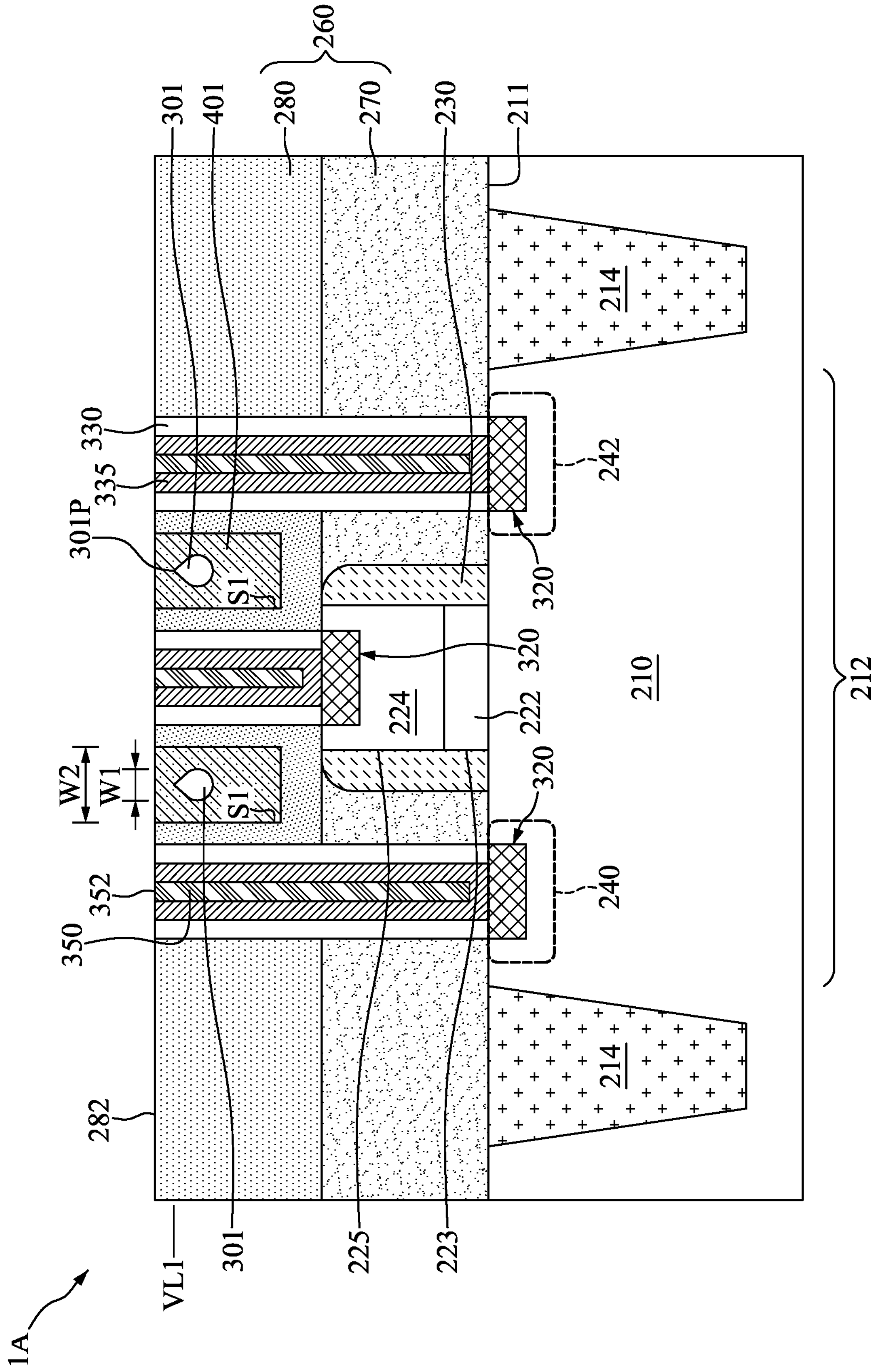

With reference to FIG. 20, a planarization process may be performed until the top surfaces 282 of the overlying dielectric layer 280 are exposed, thus turning the layer of filling material 400 into the filling layer 401 in the overlying dielectric layer 280. It should be noted that the air gap 301 is not exposed after the planarization process. In other words, the air gap 301 is completely enclosed by the filling layer 401.

In some embodiments, the planarization process may comprise chemical mechanical polishing. In some embodiments, the planarization process may comprise an etch-back process. In some embodiments, an etch rate ratio of the filling material 400 to the overlying dielectric layer 280 may be between about 100:1 and about 3:1, between about 15:1 and about 3:1, or between about 10:1 and about 5:1 during the etch-back process.

With reference to FIG. 20, a ratio of a width W2 of the filling layer 401 to a width W1 of the air gap 301 may be between about 50 and about 5, between about 40 and about 5, or between about 30 and about 5.

By employing the filling layer 401 having low dielectric constant and the air gap 301, parasitic capacitance between a conductive structure including the conductive plug 350 and an adjacent conductive structure including another conductive plug 350 may be reduced. As a result, performance of the semiconductor device 1A may be improved.

Figure 21:
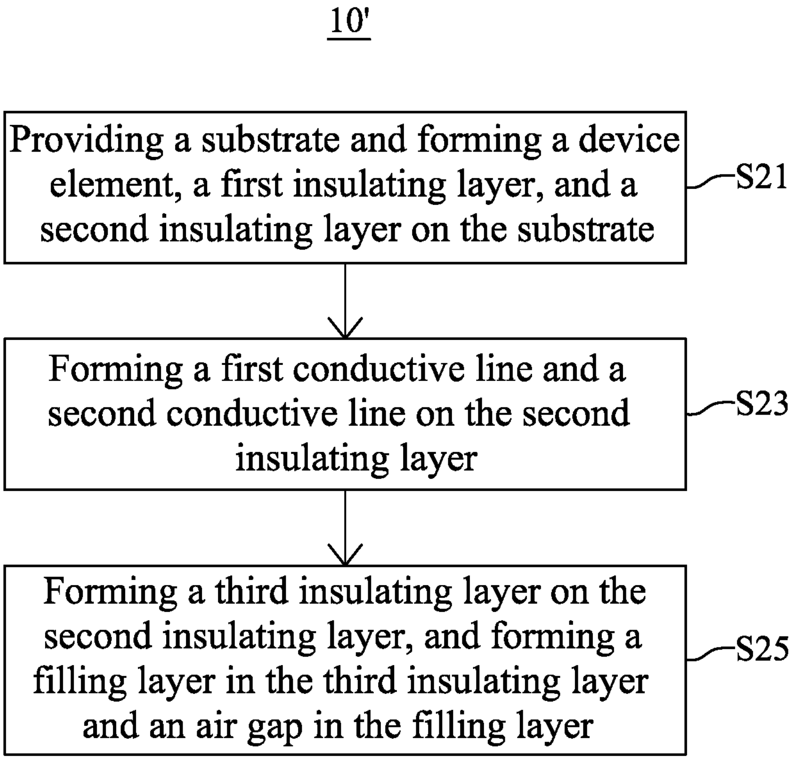
FIG. 21 illustrates, in flowchart diagram form, a method for fabricating a semiconductor device in accordance with another embodiment of the present disclosure.
Figure 22:
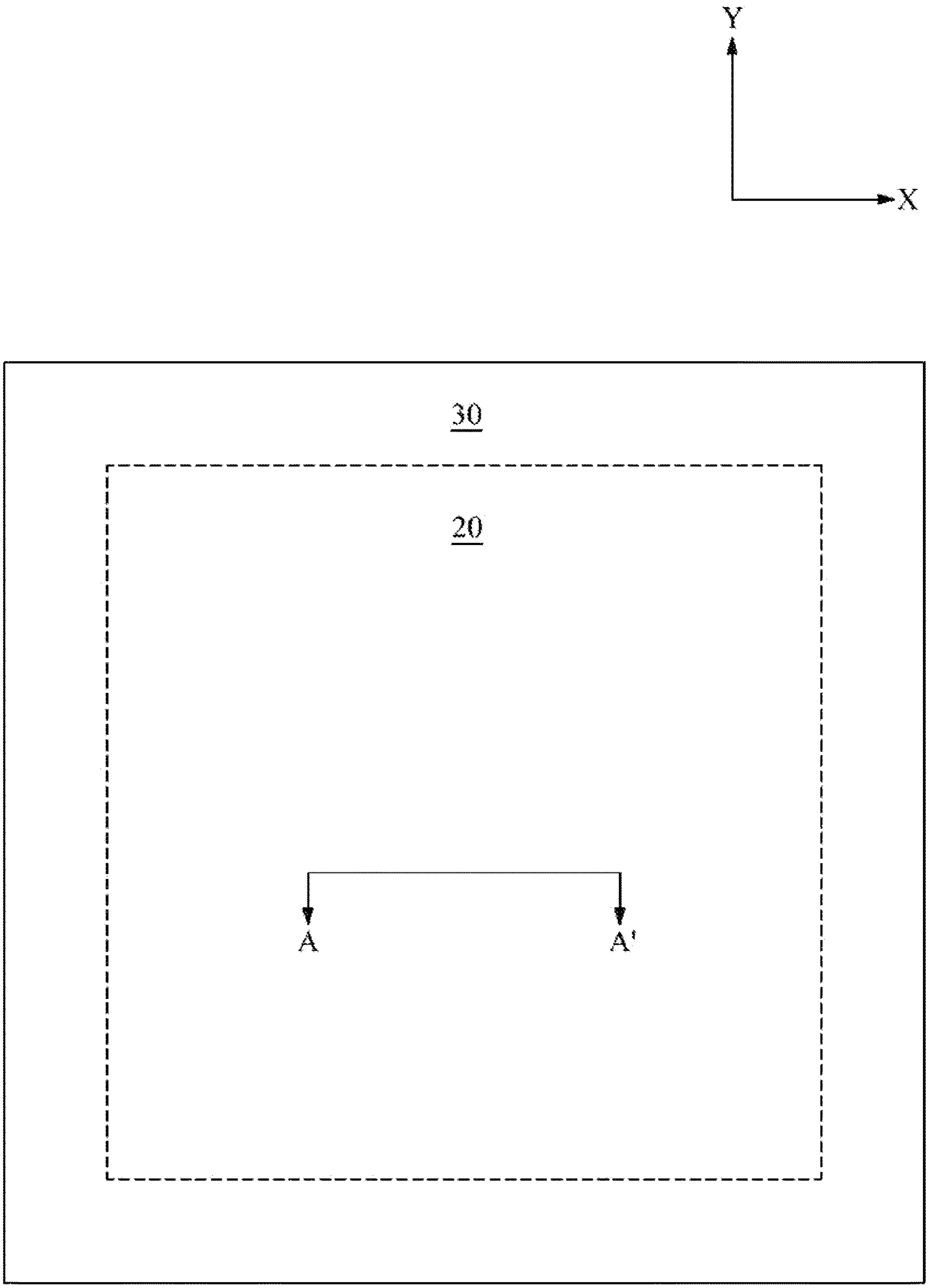
FIG. 22 illustrates, in a schematic top view diagram, an intermediate semiconductor device in accordance with another embodiment of the present disclosure.
Figure 23:
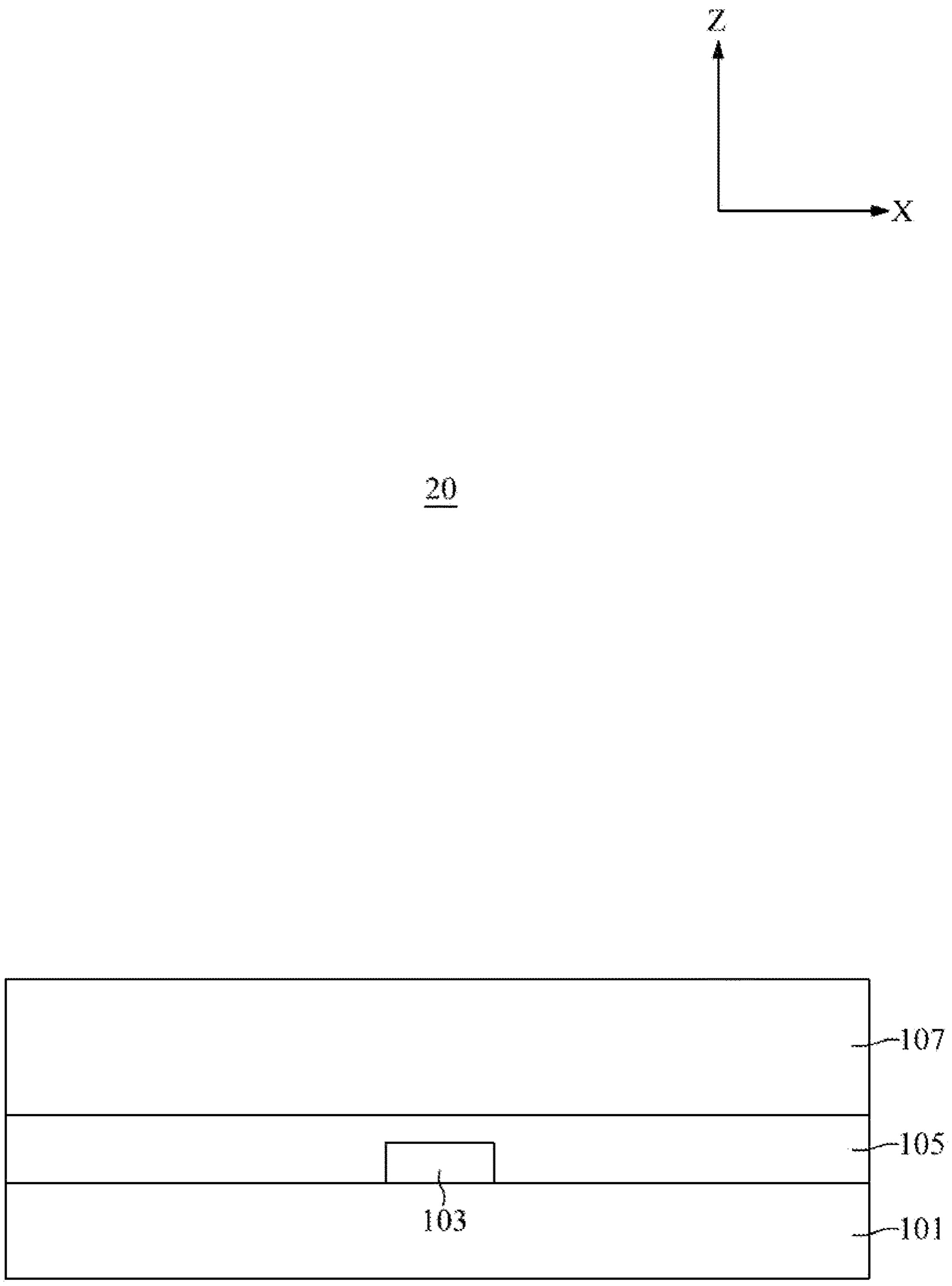
FIG. 23 is a schematic cross-sectional view diagram taken along a line A-A' in FIG. 22.

FIG. 21 illustrates, in flowchart diagram form, a method 10' for fabricating a semiconductor device 1B in accordance with another embodiment of the present disclosure. FIG. 22 illustrates, in a schematic top view diagram, an intermediate semiconductor device in accordance with another embodiment of the present disclosure. FIG. 23 is a schematic cross-sectional view diagram taken along a line A-A' in FIG. 22. Some elements of the semiconductor device of the present disclosure are not shown in FIG. 22 for clarity.

With reference to FIGS. 21 to 23, in step S21, in some embodiments, a substrate 101 may be provided and a device element 103, a first insulating layer 105, and a second insulating layer 107 may be formed on the substrate 101. The substrate 101 may include an array area 20 and a peripheral area 30. The array area 20 may be surrounded by the peripheral area 30. The substrate 101 may be formed of, for example, silicon, silicon carbide, germanium, silicon germanium, gallium arsenic, indium arsenide, indium, or other semiconductor materials including group III, group IV, and group V elements. In some embodiments, the substrate 101 may include a silicon-on-insulator structure. For example, the substrate 101 may include a buried oxide layer formed using a process such as separation by implanted oxygen.

It should be noted that the array area 20 may include a portion of the substrate 101 and a space above the portion of the substrate 101. Describing an element as being disposed on the array area 20 means that the element is disposed on a top surface of the portion of the substrate 101. Describing an element as being disposed above the array area 20 means that the element is disposed above the top surface of the portion of the substrate 101. In some embodiments, describing an element as being disposed in the array area 20 means that the element is disposed in the portion of the substrate 101; however, a top surface of the element may be even with the top surface of the portion of the substrate 101. In some embodiments, describing an element as being disposed in the array area 20 means that some portions of the element are disposed in the substrate 101 and other portions of the element are disposed on or above the substrate 101.

Accordingly, the peripheral area 30 may include another portion of the substrate 101 and a space above such another portion of the substrate 101.

With reference to FIGS. 22 and 23, the device element 103 may be formed on the substrate 101. The device element 103 may be, for example, a bipolar junction transistor, a metal-oxide-semiconductor field-effect transistor, a diode, a flash memory, a dynamic random-access memory, a static random-access memory, an electrically erasable programmable read-only memory, an image sensor, a micro-electro-mechanical system, an active device, or a passive device. The device element 103 may include a plurality of doped regions formed in the substrate 101. The plurality of doped regions may be doped with a dopant such as phosphorus, arsenic, antimony, or boron. For convenience of description, only one device element 103 is described. It should be understood that, in most situation, more device elements 103 may be present in a semiconductor device.

In some embodiments, an isolation layer (not shown in FIG. 23) may be formed in the substrate 101 and may insulate the plurality of doped regions of the device element 103 from neighboring doped regions. The isolation layer may be formed of, for example, an insulating material such as silicon oxide, silicon nitride, silicon oxynitride, silicon nitride oxide, fluoride-doped silicate, or the like. It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 22 and 23, in some embodiments, the first insulating layer 105 may be formed on the substrate 101 and may cover the device element 103. The first insulating layer 105 may be formed of, for example, silicon nitride, silicon oxide, silicon oxynitride, undoped silica glass, borosilica glass, phosphosilica glass, borophosphosilica glass, or a combination thereof, but is not limited thereto. The first insulating layer 105 may be referred to as an interlayer dielectric.

With reference to FIGS. 22 and 23, in some embodiments, the second insulating layer 107 may include a plurality of sub-layers. The plurality of sub-layers may be formed on the first insulating layer 105. Each of the plurality of sub-layers may have thicknesses between about 0.5 micrometers and about 3.0 micrometers. The plurality of sub-layers may be formed of, for example, silicon oxide, borophosphosilicate glass, undoped silicate glass, fluorinated silicate glass, low-k dielectric materials, the like, or a combination thereof. The plurality of sub-layers may be formed of different materials, but are not limited thereto. The low-k dielectric materials may have a dielectric constant less than 3.0 or even less than 2.5. In some embodiments, the low-k dielectric materials may have a dielectric constant less than 2.0. The second insulating layer 107 may be referred to as an interconnection layer.

Figure 24:
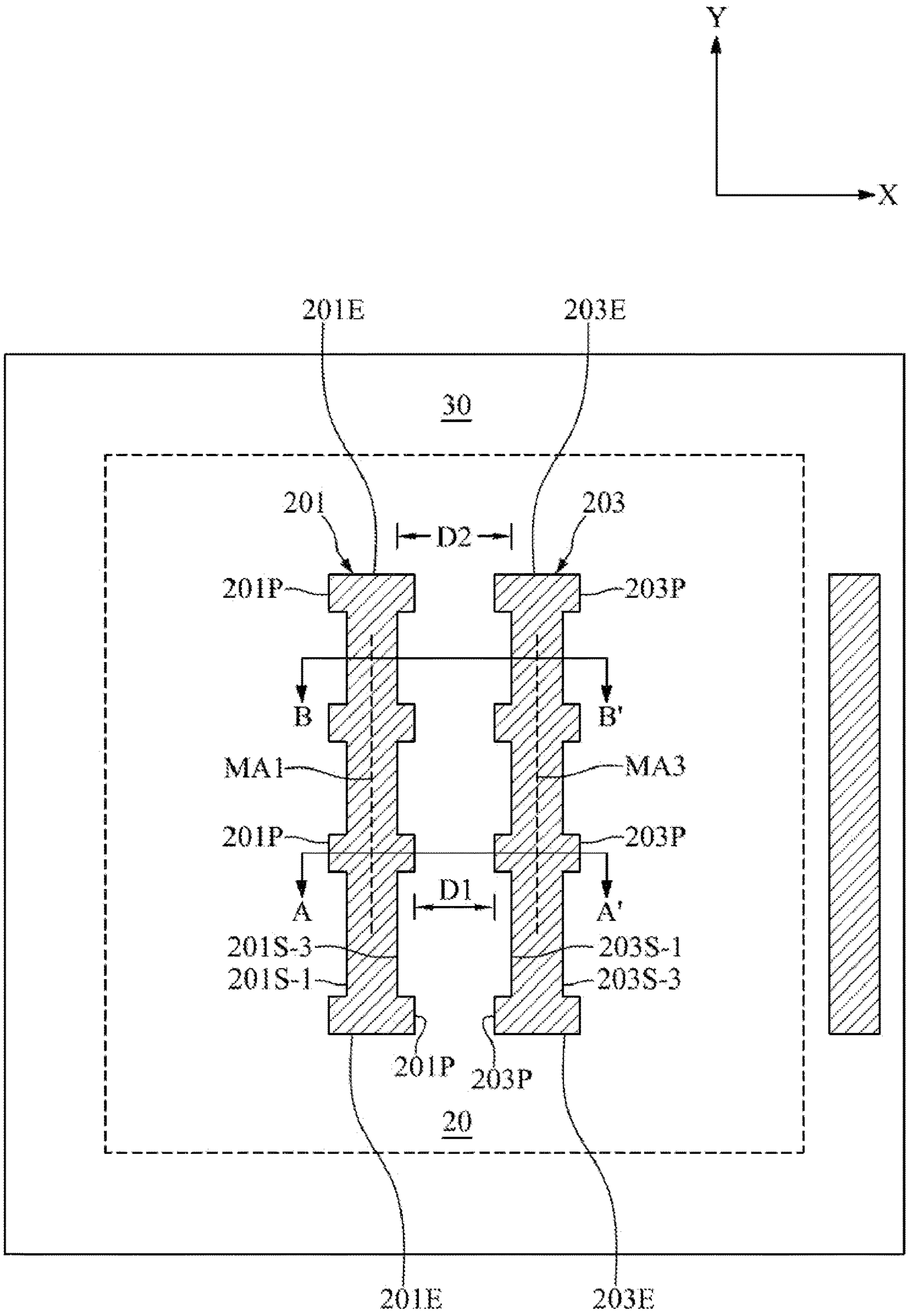
FIG. 24 illustrates, in a schematic top view diagram, an intermediate semiconductor device in accordance with another embodiment of the present disclosure.
Figure 25:
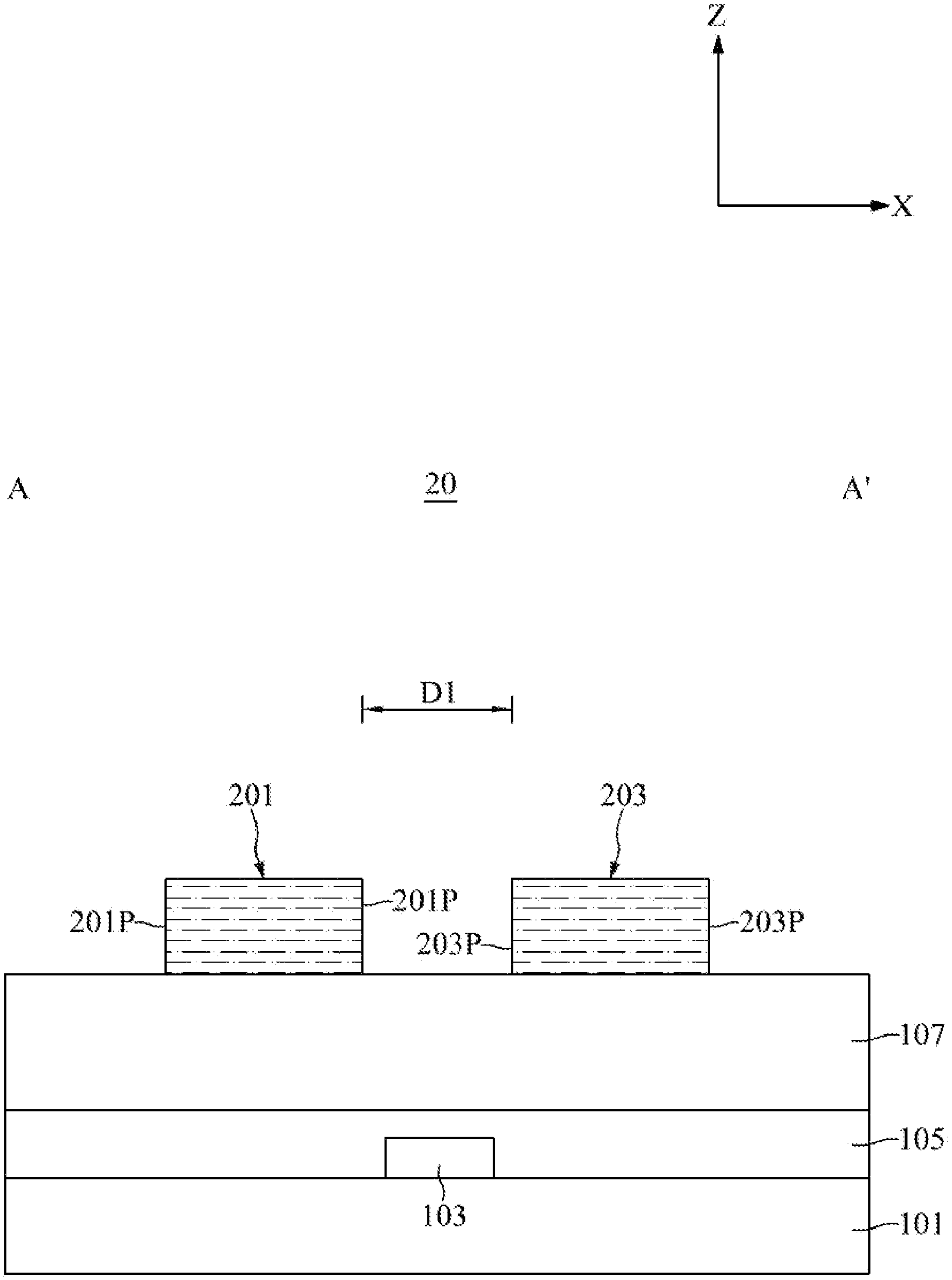
FIG. 25 is a schematic cross-sectional view diagram taken along a line A-A' in FIG. 24.
Figure 26:
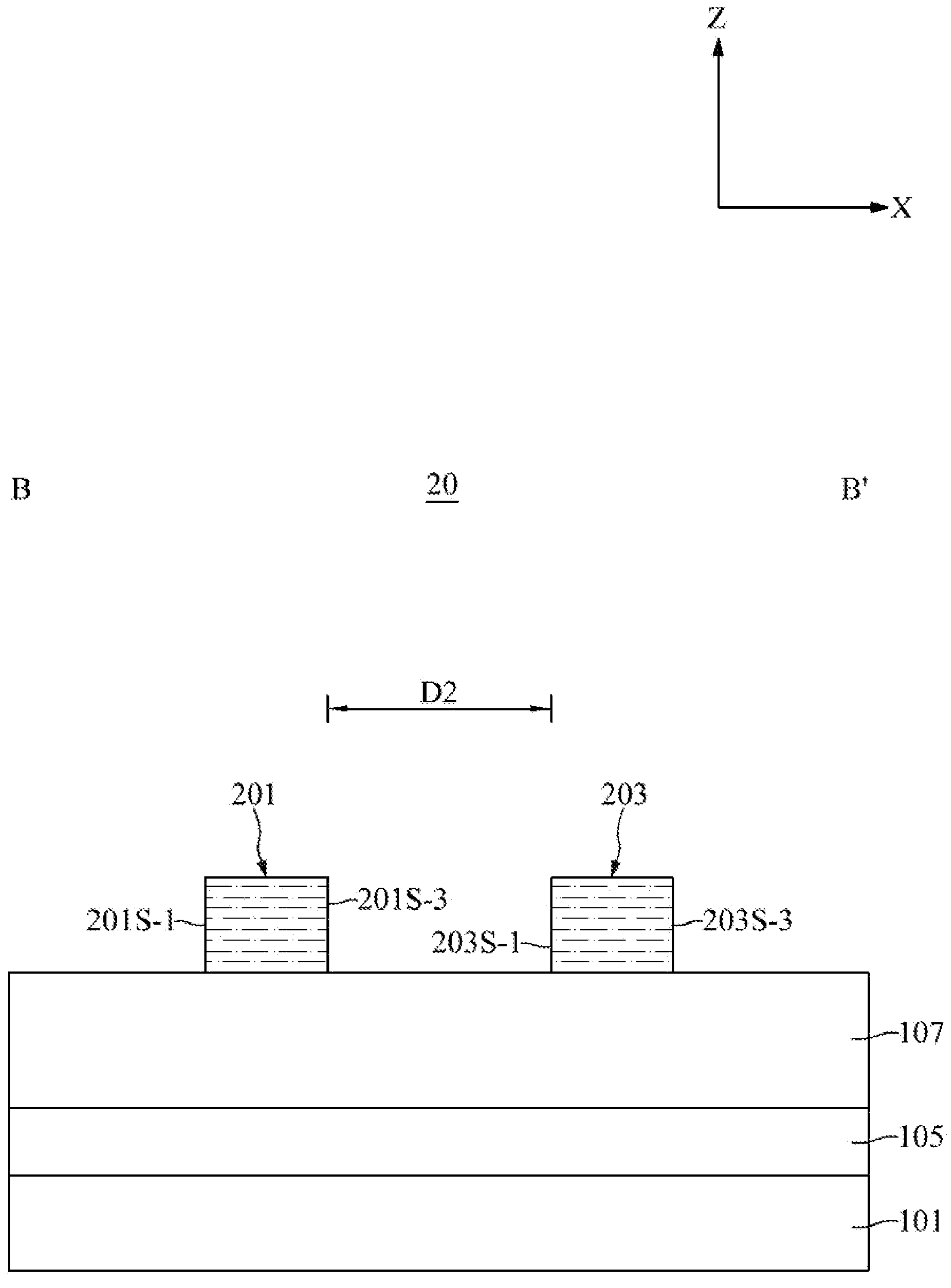
FIG. 26 is a schematic cross-sectional view diagram taken along a line B-B' in FIG. 24.

FIG. 24 illustrates, in a schematic top view diagram, an intermediate semiconductor device in accordance with another embodiment of the present disclosure. FIG. 25 is a schematic cross-sectional view diagram taken along a line A-A' in FIG. 24. FIG. 26 is a schematic cross-sectional view diagram taken along a line B-B' in FIG. 24. Some elements of the semiconductor device of the present disclosure are not shown in FIG. 24 for clarity.

With reference to FIG. 21 and FIGS. 24 to 26, in step S23, in some embodiments, a plurality of conductive features may be formed above the substrate 101; specifically, the plurality of conductive features may be formed in and on the first insulating layer 105 and the second insulating layer 107. The plurality of conductive features may include, for example, conductive lines, conductive vias, and conductive contacts. The conductive vias may connect adjacent conductive lines along the direction Z. The conductive vias may improve heat dissipation in the semiconductor device and may provide structural support in the first insulating layer 105 and the second insulating layer 107. The device element 103 may be electrically coupled to the plurality of conductive features. The plurality of conductive features may be formed of, for example, copper, aluminum, titanium, the like, or a combination thereof. The conductive lines, the conductive vias, and the conductive contacts may be formed of different materials, but are not limited thereto.

In some embodiments, the array area 20 may have an element density greater than that of the peripheral area 30. The element density may be a value defined by the elements (e.g., conductive lines) formed in the array area 20 or the peripheral area 30 divided by a surface area of the array area 20 or the peripheral area 30 from a top-view perspective. From a cross-sectional perspective, a greater density may mean a smaller horizontal distance between adjacent elements. In other words, the array area 20 may be regarded as a dense area and the peripheral area 30 may be regarded as a loose area. More conductive lines are shown in the figures to emphasize that the array area 20 is a dense area compared to the peripheral area 30.

Figure 28:
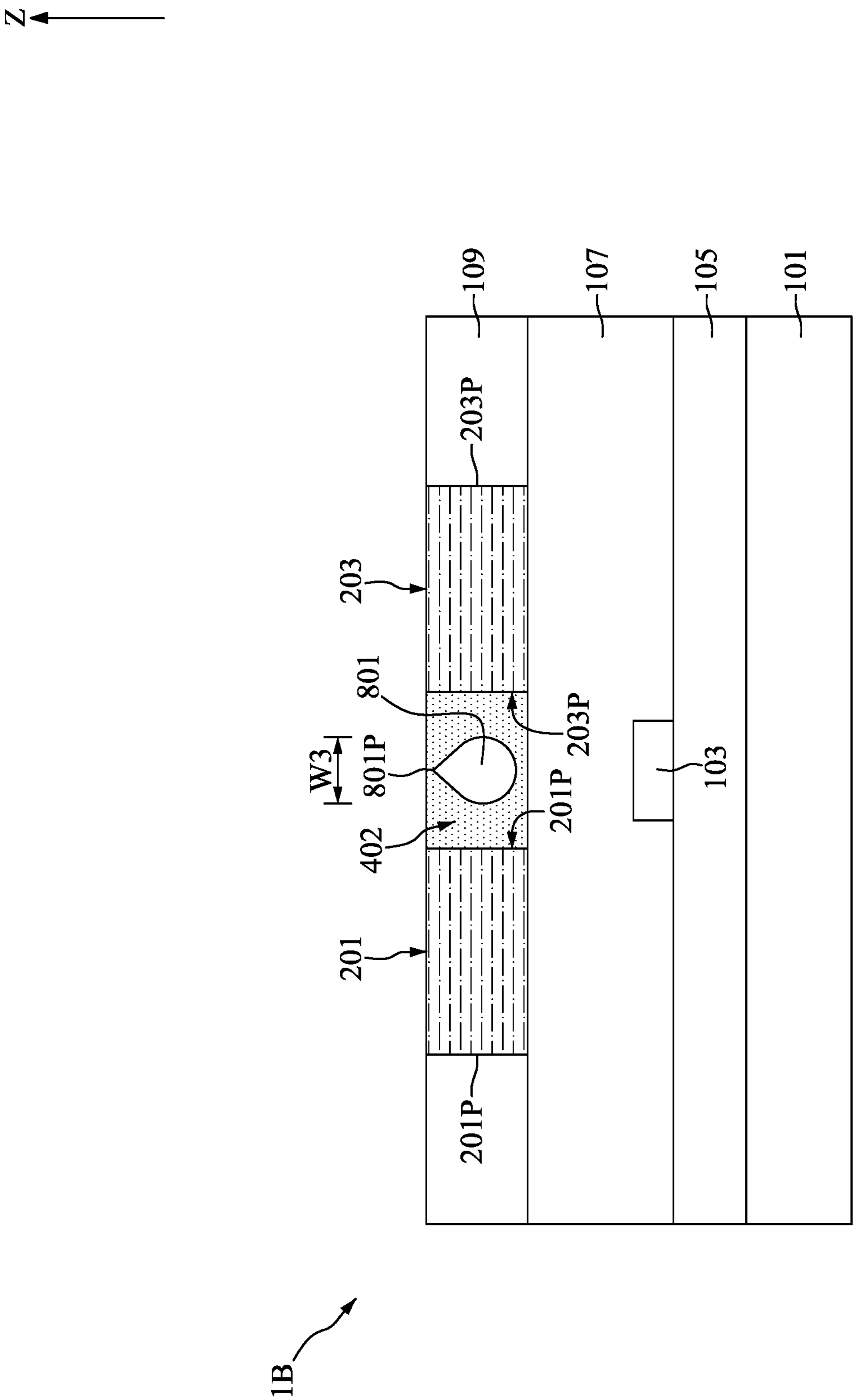
FIG. 28 is a schematic cross-sectional view diagram taken along a line A-A' in FIG. 27.

For convenience of description and clarity, only a first conductive line 201 and a second conductive line 203 are labeled in FIG. 28 and focused for description.

With reference to FIGS. 24 and 25, the first conductive line 201 may be formed on the second insulating layer 107 and may extend along a first direction Y. The first conductive line 201 may include two sides 201S-1, 201S-3, and a plurality of first protruding portions 201P. In some embodiments, the plurality of first protruding portions 201P may be at the two sides 201S-1, 201S-3 of the first conductive line 201. The plurality of first protruding portions 201P at the side 201S-1 may be opposite to the plurality of first protruding portions 201P at the side 201S-3. In other words, from a top-view perspective, the corresponding first protruding portions 201P on both sides 201S1-1, 201S-3 may be located along a line parallel to a second direction X. From a top-view perspective, some of the plurality of first protruding portions 201P may be located at ends 201E of the first conductive line 201 and some other of the plurality of first protruding portions 201P may be located at a middle of the first conductive line 201. In some embodiments, the plurality of first protruding portions 201P at the side 201S-1 may be offset from the plurality of first protruding portions 201P at the side 201S-3. In some embodiments, the plurality of first protruding portions 201P may be disposed only at the side 201S-3 which faces toward the second conductive line 203, as discussed below.

With reference to FIGS. 24 and 25, in some embodiments, the second conductive line 203 may be formed on the second insulating layer 107. The second conductive line 203 may extend along the first direction Y and may be adjacent to the first conductive line 201. In some embodiments, only a portion of the second conductive line 203 may be parallel to and adjacent to the first conductive line 201. In some embodiments, the second conductive line 203 may be parallel to and adjacent to only a portion of the first conductive line 201. The second conductive line 203 may include two sides 203S-1, 203S-3 and a plurality of second protruding portions 203P. In some embodiments, the plurality of second protruding portions 203P may be at the two sides 203S-1, 203S-3 of the second conductive line 203. The plurality of second protruding portions 203P at the side 203S-1 may respectively correspondingly face toward the plurality of first protruding portions 201P at the side 201S-3. The plurality of second protruding portions 203P at the side 203S-3 may be opposite to or offset from the plurality of second protruding portions 203P at the side 203S-1.

Spaces between the plurality of first protruding portions 201P at the side 201S-3 and the plurality of second protruding portions 203P at the side 203S-1 may be narrower than spaces between the side 201S-3 of the first conductive line 201 and the side 203S-1 of the second conductive line 203. In other words, from a top-view perspective, distances D1 between the plurality of first protruding portions 201P at the side 201S-3 and the plurality of second protruding portions 203P at the side 203S-1 may be less than a distance D2 between the side 201S-3 of the first conductive line 201 and the side 203S-1 of the second conductive line 203.

With reference to FIGS. 24 and 25, in some embodiments, the plurality of second protruding portions 203P at the side 203S-1 may be offset from the plurality of first protruding portions 201P at the side 201S-3. The spaces between the plurality of first protruding portions 201P at the side 201S-3 and the side 203S-1 of the second conductive line 203 and the spaces between the plurality of second protruding portions 203P at the side 203S-1 and the side 201S-3 of the first conductive line 201 may be narrower than the spaces between the side 201S-3 of the first conductive line 201 and the side 203S-1 of the second conductive line 203.

It should be noted that the direction of the first conductive line 201 and the direction of the second conductive line 203 are for illustration purpose only. For example, the first conductive line 201 and the second conductive line 203 may extend along the second direction X. For another example, the first conductive line 201 and the second conductive line 203 may extend along a direction diagonal with respect to both the first direction Y and the second direction X. In yet another example, from a top-view perspective, the first conductive line 201 and the second conductive line 203 may each be L-shaped. That is, the first conductive line 201 and the second conductive line 203 may concurrently extend along two directions such as the first direction Y and the second direction X. In still another example, from a top-view perspective, the first conductive line 201 and the second conductive line 203 may each be U-shaped, T-shaped, or another applicable shape.

Figure 27:
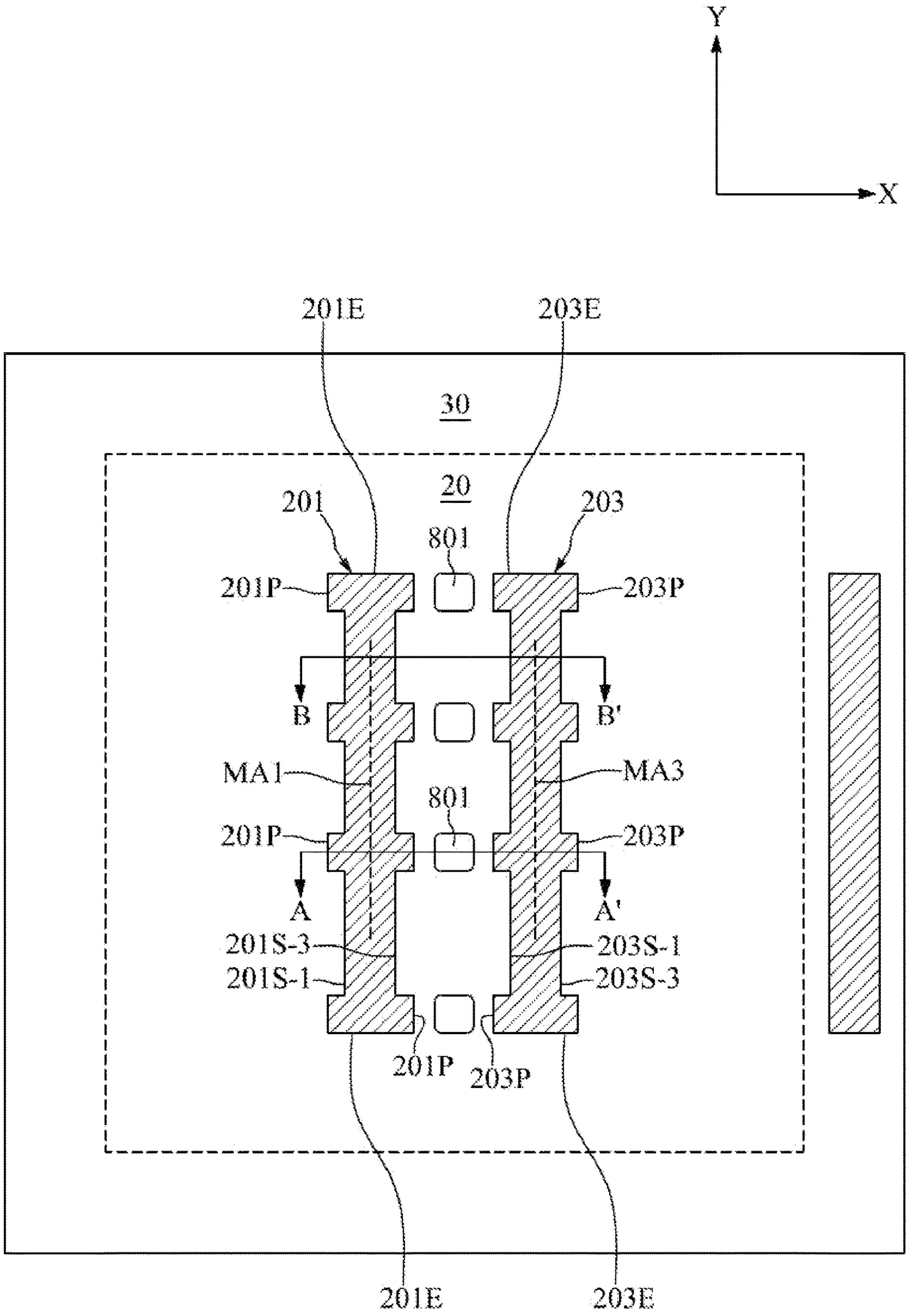
FIG. 27 illustrates, in a schematic top view diagram, an intermediate semiconductor device in accordance with another embodiment of the present disclosure.

FIG. 27 illustrates, in a schematic top view diagram, an intermediate semiconductor device in accordance with another embodiment of the present disclosure. FIG. 28 is a schematic cross-sectional view diagram taken along a line A-A' in FIG. 27. Some elements of the semiconductor device of the present disclosure are not shown in FIG. 27 for clarity.

With reference to FIG. 21 and FIGS. 27 to 28, in step S25, in some embodiments, a third insulating layer 109 may be formed on the second insulating layer 107, a filling layer 402 may be formed in the third insulating layer 109, and a plurality of air gaps 801 may be formed in the filling layer 402.

With reference to FIG. 28, the third insulating layer 109 may be formed by depositing an insulating material over the intermediate semiconductor device illustrated in FIGS. 24 to 26 by a deposition process such as chemical vapor deposition. A planarization process, such as chemical mechanical polishing, may be subsequently performed until the top surfaces of the first conductive line 201 and the second conductive line 203 are exposed to remove excess material, thus providing a substantially flat surface for subsequent processing steps. The insulating material may be same as a material of the second insulating layer 107, but is not limited thereto.

With reference to FIGS. 27 and 28, in some embodiments, the filling layer 402 may be formed between the plurality of first protruding portions 201P at the side 201S-3 and the plurality of second protruding portions 203P at the side 203S-1. The formation of the filling layer 402 and the plurality of air gaps 801 is similar to, or same as, the formation of the filling layer 401 (as shown in FIGS. 17 through 20), and details thereof are not repeated herein. In some embodiments, the filling material 402 may include boron carbonitride. It should be noted that the air gap 801 is not exposed after the planarization process. In other words, the air gap 801 is completely enclosed by the filling layer 402.

One aspect of the present disclosure provides a semiconductor device including a substrate; a gate electrode disposed on the substrate; a source region and a drain region disposed in the substrate and on opposite sides of the gate electrode; an isolating layer disposed over the substrate and the gate electrode; a plurality of metal contacts disposed in the gate electrode, the source region, and the drain region; a contact liner disposed in the isolating layer; a plurality of conductive plugs disposed in the isolating layer, surrounded by the contact liner, and electrically coupled to the metal contacts; and a filling layer disposed in the isolating layer. The filling layer includes boron carbonitride.

Another aspect of the present disclosure provides a semiconductor device including a substrate; a device element disposed on the substrate; a first insulating layer disposed on the substrate and covering the device element; a second insulating layer disposed on the first insulating layer; a plurality of first conductive lines and a plurality of second conductive lines disposed on the second insulating layer; a third insulating layer disposed on the second insulating layer and covering the plurality of first conductive lines and the plurality of second conductive lines; and a filling layer disposed on the second insulating layer and in the third insulating layer. The filling layer includes boron carbonitride.

Another aspect of the present disclosure provides a method for fabricating a semiconductor device including providing a substrate; forming a gate electrode over the substrate; forming a source region and a drain region in the substrate; depositing an isolating layer over the substrate and the gate electrode; providing a patterned photoresist over the isolating layer; forming a plurality of contact holes in the isolating layer to expose the gate electrode, the source region, and the drain region; forming a plurality of metal contacts in the gate electrode, the source region, and the drain region; forming a contact liner in the contact holes; forming a plurality of conductive plugs in the contact holes, wherein the plurality of conductive plugs are surrounded by the contact liner; and forming a filling layer in the isolating layer. The filling layer includes boron carbonitride.

Another aspect of the present disclosure provides a method for fabricating a semiconductor device including forming a first conductive line comprising a first protruding portion at one side of the first conductive line; forming a second conductive line comprising a second protruding portion at one side of the second conductive line and facing toward the first protruding portion; and forming a filling layer between the first protruding portion and the second protruding portion. The filling layer includes boron carbonitride.

Due to the design of the semiconductor device of the present disclosure, parasitic capacitance between a conductive structure including a conductive plug and an adjacent conductive structure including another conductive plug may be reduced by employing a filling layer having low dielectric constant and an air gap. As a result, performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:

a substrate;

a gate electrode disposed on the substrate;

a source region and a drain region disposed in the substrate and on opposite sides of the gate electrode;

an isolating layer disposed over the substrate and the gate electrode, wherein the isolating layer has a space indented from a top surface of the isolating layer to define a bottom surface of the space above a bottom surface of the isolating layer;

a plurality of metal contacts disposed in the gate electrode, the source region, and the drain region;

a contact liner disposed in the isolating layer;

a plurality of conductive plugs disposed in the isolating layer and surrounded by the contact liner, and electrically coupled to the metal contacts; and a filling layer disposed in the space of the isolating layer;

wherein a top surface of the filling layer is coplanar with the top surface of the isolating layer;

wherein the filling layer includes boron carbonitride.

2. The semiconductor device of claim 1, further comprising a plurality of air gaps, wherein at least one of the air gaps is disposed within the space of isolating layer, in the filling layer and enclosed by the filling layer.

3. The semiconductor device of claim 1, wherein the semiconductor device further includes a barrier layer disposed between the plurality of conductive plugs and the contact liner.

4. The semiconductor device of claim 1, wherein the isolating layer includes an underlying dielectric layer and an overlying dielectric layer, wherein the underlying dielectric layer is disposed on the substrate and surrounds the gate electrode, and the overlying dielectric layer is disposed over the underlying dielectric layer and the gate electrode, wherein the space is indented from a top surface of the overlying dielectric layer at a position that the bottom surface of the space is at a vertical level higher than a bottom surface of the overlying dielectric layer, such that the filling layer is formed at the overlying dielectric layer at a position that a bottom surface of the filling layer is at a vertical level higher than the bottom surface of the overlying dielectric layer.

5. The semiconductor device of claim 4, wherein a top portion of the air gap is located at a vertical level lower than the top surface of the overlying dielectric layer, wherein the air gap is located above the underlying dielectric layer.

6. The semiconductor device of claim 4, wherein a top surface of the plurality of metal contacts in the gate electrode is coplanar with an upper surface of the underlying dielectric layer, and top surfaces of the other metal contacts in the source region and the drain region are coplanar with a front surface of the substrate, wherein the upper surface of the underlying dielectric layer is in contact with the bottom surface of the overlying dielectric layer, such that the bottom surface of the space is at a vertical level higher than the upper surface of the underlying dielectric layer.

7. The semiconductor device of claim 1, wherein the semiconductor device further includes a gate dielectric and a gate spacer, wherein the gate dielectric is disposed between the substrate and the gate electrode, and the gate spacer is disposed on sidewalls of the gate electrode and the gate dielectric.

8. The semiconductor device of claim 1, wherein the semiconductor device further includes a plurality of isolating regions disposed in the substrate to define and electrically isolate one or more active areas comprising the gate electrode, the source region, and the drain region.

9. The semiconductor device of claim 8, wherein the isolating regions are shallow trench isolation structures.

10. The semiconductor device of claim 2, wherein a ratio of a width of the filling layer to a width of the air gaps is between about 5 and about 50, between about 5 and about 40, or between about 5 and about 30.

* * * * *